United States Patent [19]

Ohmi et al.

[11] Patent Number: 5,073,232

[45] Date of Patent: Dec. 17, 1991

[54] METHOD OF ANHYDROUS HYDROGEN FLUORIDE ETCHING

[75] Inventors: Tadahiro Ohmi, Sendai; Masahiro Miki, Osaka; Hirohisa Kikuyama, Nara; Matagoro Maeno, Osaka, all of Japan

[73] Assignee: Hashimoto Chemical Industries Co., Ltd., Osaka, Japan

[21] Appl. No.: 454,575

[22] Filed: Dec. 21, 1989

Related U.S. Application Data

[62] Division of Ser. No. 381,913, Jul. 19, 1989, abandoned.

[30] Foreign Application Priority Data

Jul. 20, 1988 [JP] Japan .................. 63-181224
Jul. 20, 1988 [JP] Japan .................. 63-181226

[51] Int. Cl.$^5$ ........................... H01L 21/306
[52] U.S. Cl. ..................... 156/646; 252/79.3; 156/345
[58] Field of Search .............. 156/646, 345, 655; 252/79.3

[56] References Cited

U.S. PATENT DOCUMENTS 4,749,440 6/1988 Blackwood et al. ............... 156/646

FOREIGN PATENT DOCUMENTS 56-88320 7/1981 Japan .
59-166675 9/1984 Japan .
61-148820 7/1986 Japan .

OTHER PUBLICATIONS

Baklanov et al., Kinetics of the etching of silica layers by gaseous hydrogen fluoride, Izv. Sib. Otd. Akad. Nauk SSSR Ser. Khim. Nauk, (1), 25–29, (1987).
Zazzera et al., XPS and SIMS Study of Anhydrous HF and UV/ozone Modified Silicon Surfaces, ECS Symposium Abstract, No. 188, (1988).

*Primary Examiner*—Kenneth M. Schor
*Assistant Examiner*—John J. Bruckner
*Attorney, Agent, or Firm*—Armstrong, Nikaido, Marmelstein, Kubovcik & Murray

[57] ABSTRACT

Disclosed is a dry-etching apparatus composed of any of metal, silica, ceramic or combination thereof including a processing chamber in which substrates are placed and a diluted anhydrous hydrogen fluoride gas generator, the processing chamber being connected to the diluted anhydrous hydrogen fluoride gas generator through a pipe line of such metal as stainless steel or nickel. There is also provided according to the invention a dry-etching method with the dry-etching apparatus, a cooled anhydrous hydrogen fluoride gas source and a diluted anhydrous hydrogen gas generator used in the dry-etching apparatus and dry-etching method.

2 Claims, 18 Drawing Sheets

METHOD OF ANHYDROUS HYDROGEN FLUORIDE ETCHING

This is a division of application Ser. No. 381,913 filed July 19, 1989, now abandoned.

BACKGROUND OF THE INVENTION

1. Field of the Invention

The present invention relates to a dry etching apparatus, a dryetching method and a diluted anhydrous fluoride gas generator, and more particularly, to an apparatus and a method capable of selectively cleaning surface of substrate and removing various unnecessary films formed on the surface of substrate in the process of semiconductor production and a diluted anhydrous hydrogen fluoride gas generator for use therein.

2. Description of Prior Arts

It is a recent trend that etching of film from the surface of substrate by gas (or vapor) phase method is carried out under the presence of moisture (i.e., $H_2O$) of high concentration using a mixture gas of hydrogen fluoride gas and water vapor. For example, the Japanese Patent Application laid-open under Publications Nos. Sho 56-88320 and 59-166675 (unexamined) disclose a reaction which is performed by applying hydrogen fluoride gas vaporized from hydrofluoric acid. Further, the Japanese Patent Application laid-open under Publication No. Sho 62-502930 (unexamined) discloses a method in which a hydrogen fluoride gas containing moisture of high concentration is prepared by adding anhydrous hydrogen fluoride gas to water vapor.

However, in the mixture wherein hydrofluoric gas is mixed with vapor, reactivity with oxide film and other reactive films is so high that neither control of film etching rate nor selective etching of films according to their kind can be achieved. For example, it is almost impossible to etch away an unnecessary film such as native oxide film alone from the surface of a substrate on which thermal oxide film, CVD film, BSG film and native oxide film are mixedly formed.

Moreover, hydrogen fluoride gas mixed with moisture of high concentration brings about high corrosivity, and any metal cannot be used as components of apparatus, particularly as gas pipe line through which moistured hydrogen fluoride gas is supplied. Accordingly, it is obliged to employ a pipe line or a chamber made of certain polymeric resin or fluororesin, which brings about further problems in view of handling and installation. When using a gas pipe line and chamber of polymeric resin or fluororesin, there is a further disadvantage in such an aspect as joint, and it is impossible to perfectly prevent the pipe line from entrance of components of atmospheric air from outside. As a result, clean process cannot be achieved.

SUMMARY OF THE INVENTION

An object of the present invention is therefore to provide an apparatus in which, among various films intricately formed on the surface of a semiconductor substrate, necessary films are left thereon while unnecessary film or films being etched therefrom utilizing a difference between their individual reactivities with fluorine by changing concentration of hydrogen fluoride.

Another object of the invention is to provide the foregoing apparatus wherein at least gas pipe line connected to a reaction chamber is made of metal so that a gas of ultra-clean grade may be supplied therethrough while reducing metallic corrosion by using a diluted anhydrous hydrogen fluoride gas of very little moisture.

In order to accomplish the foregoing objects, the inventors have been engaged in studies of dry etching apparatus, and developed a dry etching apparatus composed of any of metal, silica, ceramic or combination thereof comprising a processing chamber in which substrates are placed, and a diluted anhydrous hydrogen fluoride gas generator, the apparatus being characterized in that said processing chamber is connected to said diluted anhydrous hydrogen fluoride gas generator through a pipe line made of such a metal as stainless steel or nickel, and an inert gas supply pipe line is connected to a branch point between said processing chamber and said diluted anhydrous hydrogen fluoride gas generator.

Being quite different from the prior arts, in the etching of film from the surface of substrate by using the gas phase method in accordance with the invention, an inert gas is mixed with a diluted anhydrous hydrogen fluoride gas containing very little moisture at any ratio to change concentration of hydrogen fluoride, whereby at least one of various kinds of films formed on the surface of semiconductor substrate (or wafer) is selectively etched away utilizing difference between the reactivities with hydrogen fluoride gas. To be more specific, there is provided in accordance with the invention an apparatus in which at least one of complex films composed of not less than two kinds of films, each being reactive with hydrogen fluoride, can be selectively etched away by using a diluted anhydrous hydrogen fluoride gas whose concentration of moisture ($H_2O$) is several tens vppm, preferably not more than 10 vppm, more preferably not more than several vppm, and whose concentration of hydrogen fluoride is not more than 10 v %, preferably not more than 5 v %. In this respect, the letter "v" prefixed to each of the aforesaid values means volume (or capacity). Silicon film such as thermally oxidated $SiO_2$ film, CVD $SiO_2$ film; CVD film (PSG film, BSG film, BPSG film) doped with phosphorus or boron; and very thin native oxide film formed by thermal, chemical or air oxidation are shown as examples of the aforesaid films reactive with hydrogen fluoride on the semiconductor substrate.

Thus, in the production process of ULSI requiring such a selectivity as etching of unnecessary film while leaving necessary film completely, selective etching is now achieved by using reaction area between a diluted anhydrous hydrogen fluoride gas and a film as disclosed in the invention, even in the event of a variety of films intricately formed. Accordingly, in the production process of submicron LSI for example, etching of native oxide film remaining on the surface of a semiconductor substrate in accordance with the invention will significantly contribute not only to improvement in quality of thin films to be laminated on the surface of semiconductor substrate, but also to decrease in processing temperature.

Wet process with a certain chemical and DI water has been heretofore essential in performing cleaning of semiconductor substrate. However, when attempting to clean completely such portion as internal part of deep via holes of very small diameter in the manufacturing process of submicron LSI whose pattern dimensions are greatly reduced, the cleaning is very difficult because of wettability of interface between solid and liquid, influence by surface tension, etc. It has been well known that organic pollution on the substrate can be removed with ozone and metallic removal with chlorine radical both in dry process. A problem exists, however, in that Si surface is oxidated by ozone resulting in native oxide film of 5 to 10 Å sticked thereto. Thus, it was almost impossible to obtain a metal-silicon contact or a silicon-silicon contact with low contact resistance. In other words, it has been impossible at all to carry out the entire manufacturing process of semiconductor completely in dry process.

On the other hand, in the invention, native oxide films sticked to the silicon surface provided with via holes on the substrate surface on which thermal oxide film, CVD $SiO_2$ film, BSG film, etc. are extensively formed can be selectively etched away with diluted anhydrous hydrogen fluoride gas. Therefore, an advantage is that contact resistance of n+Si, metal contact and P Si, metal contact can be easily reduced to $1 \times 10^{-8}$ $\Omega \cdot cm^2$., thus manufacturing process of semiconductor can be carried out completely in dry process.

Since a diluted anhydrous hydrogen fluoride gas of very little moisture is applied herein, not only gas supply pipe line made of stainless steel or nickel which is technically well established, but also processing chamber made of metal such as stainless steel, nickel, silica or ceramic can be practically used. As a result, a very clean high quality process essential to the manufacture of submicron ULSI is achieved. In the event of employing gas pipe line made of polymeric material or organic substance, no such clean high quality process is achieved at all due to considerable leaking outside and a very large amount of outgassing.

Though the invention is described later in detail mainly on the manufacture of submicron ULSI, the invention is also useful for every industrial field requiring delicate processing techniques such as flat panel display to be formed on a substrate of glass or silica.

It is recommended that internal surfaces of the pipe line, chamber and diluted anhydrous hydrogen fluoride gas generator used in the invention are passivated in accordance with the applicant's preceding Japanese application titled "metallic material on which passivated film is formed and apparatus composed thereof" filed on July 20, 1988 in view of increase in reliability and prolongation of life, which eventually results in effective manufacturing technique of high grade semiconductors.

The invention also includes a diluted anhydrous hydrogen fluoride gas generator for use in the dry etching apparatus mentioned above. The gas generator comprises a metal container having an inlet and an outlet of inert gas, and a cooler which cools the metal container to a prescribed temperature, the inlet and the outlet of inert gas being both disposed in such a manner as not to contact liquid level of a liquefied anhydrous hydrogen fluoride gas with which the metal container is filled.

Hitherto, as is disclosed in the Japanese Patent Application laid open under the Publication No. Sho 59-16675, a method is employed wherein a nitrogen gas is sprayed on a rich hydrofluoric acid solution and a vaporized hydrogen fluoride gas is sent out together with the nitrogen gas. In this method, however, there is a disadvantage of not being able to produce a diluted gas containing a dry hydrogen fluoride because not only hydrogen fluoride but also water is vaporized, and besides there is another disadvantage of being almost impossible to determine the content of hydrogen fluoride.

Moreover, since hydrofluoric acid is used, corrosivity is very high and, therefore, only certain containers such as the ones made of polymer can be used. When using such containers of polymer, there arise further disadvantages such that a large amount of atmospheric components come to be mixed because of significant outside leak at the gas pipe fitting section, and that it is substantially impossible to produce a highly pure diluted hydrogen fluoride gas not containing moisture because of outgassing from the polymer.

The Japanese Patent Publication No. Sho 62-502930 discloses a process comprising the steps of heating a cylinder filled with a anhydrous hydrogen fluoride to 26° C., measuring the amount of generation thereof with a flowmeter, and mixing the generated hydrogen fluoride with a certain amount of nitrogen gas. This process, however, has a disadvantage of vaporizing moisture contained in the hydrogen fluoride together, and it is also impossible to produce a highly pure diluted hydrogen fluoride gas by this process.

Furthermore, even with the process of producing a nitrogen gas by bubbling it into a liquefied anhydrous hydrogen fluoride, it is impossible to obtain a diluted anhydrous hydrogen fluoride of low moisture, because moisture increases due to the bubbling which invites unbalance between gas and liquid.

To overcome the foregoing drawbacks of the prior arts, the diluted gas generator according to the invention is featured by the requirements such that both inlet and outlet of inert gas are provided in such a manner as not to contact the liquid level of liquefied anhydrous hydrogen fluoride contained in the container, that a cooler is provided, and that the entire device or at least the portion to be in contact with anhydrous hydrogen fluoride is made of metal.

In the diluted anhydrous hydrogen fluoride gas generator of above construction, since the inlet and outlet of inert gas are both arranged in such a manner as defined above, any inert gas can be continuously supplied to a gaseous phase portion of the container containing a liquefied anhydrous hydrogen fluoride cooled to a required temperature, and a diluted anhydrous hydrogen fluoride gas containing a certain concentration of hydrogen fluoride and a very small amount of moisture in the range of 0.001 to 0.3 vppm can be generated by balancing the pressure of vapored hydrogen fluoride and that of vapored moisture. It is to be noted that a cooler is essential in the invention for the purpose of cooling the liquefied anhydrous hydrogen fluoride to a required temperature.

Because a liquefied anhydrous hydrogen fluoride containing a very small amount of moisture in the range of about 0.1 to 100 ppm is generally used in the gas generator according to the invention, a certain kind of metals, preferably stainless steel and nickel, are applicable as components of the gas generator.

Other objects and advantages of the invention will become apparent in the course of the following description with reference to the accompanying drawings.

DESCRIPTION OF PREFERRED EMBODIMENTS

In order to carrying out film removal with diluted anhydrous hydrogen fluoride gas under the condition of very little moisture, components of the apparatus can be made of metals in the invention.

Figure 1:
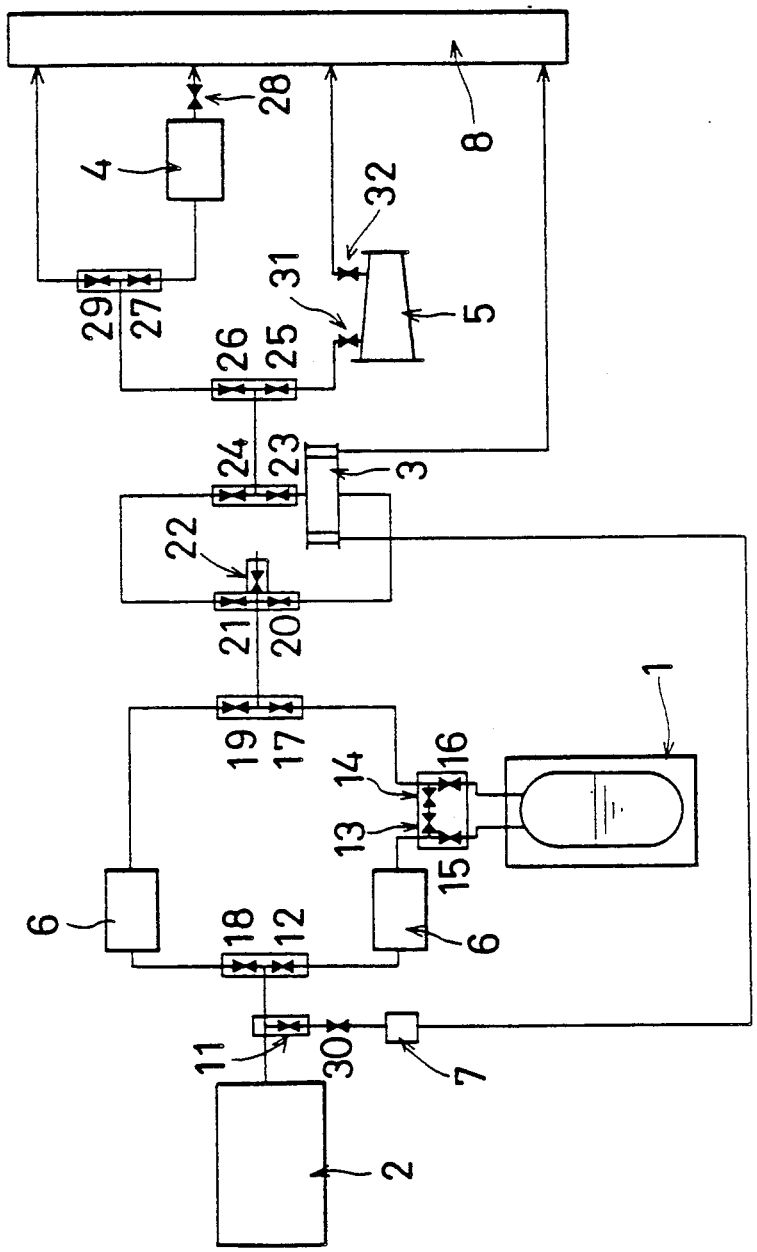
FIG. 1 is a schematic diagram of the dry etching apparatus in accordance with the present invention.

Referring now to FIG. 1 illustrating a schematic diagram of an example of the apparatus in accordance with the invention, reference numeral 1 indicates a diluted anhydrous hydrogen fluoride gas generator such as the one invented and filed separately by the inventors to the Japanese Patent Office on July 20, 1988, by which a certain grade of diluted anhydrous hydrogen fluoride gas required in the invention can be easily generated and supplied. The generator 1 can generate a diluted anhydrous hydrogen fluoride gas which contains a required hydrogen fluoride whose moisture content is very small even when the gas amount is small.

Numeral 2 indicates an inert gas cylinder which supplies the processing chamber with the diluted anhydrous hydrogen fluoride gas otherwise purges the inside of the processing chamber to be anhydrous, and wherein nitrogen, argon, helium or the like are used as the inert gas. The inert gas can be also supplied from a liquified gas storage tank or on-site plant as a matter of course. In FIG. 1, the gas pipe line extending from the diluted anhydrous hydrogen fluoride gas generator 1 to the processing chamber 3 is made of stainelss steel or nickel. The substrate processing chamber 3 illustrated in FIG. 1 is made of nickel, which is also enlargedly illustrated in FIG. 2, in the form of processing a piece of substrate placed laterally. It is, however, also preferable to form the chamber into such a construction of silica as illustrated in FIG. 3 so as to be able to process a plurality of substrates. Numeral 4 indicates a dew-point meter which is used for measuring concentration of moisture in the processing chamber. Numeral 5 indicates a monitor which analizes concentration of diluted anhydrous hydrogen fluoride gas and production of reaction products such as silicon tetrafluoride gas. Gas chromatograph, mass spectrometer or infrared spectrophotometer (hereinafter referred to as "IR") is used as the monitor. An example employing an IR is herein shown. The dew-point meter and IR are not always necessary, but it is more convenient using them because concentration of moisture and hydrogen fluoride as well as production of silicon tetrafluoride gas can be acknowledged by them.

For eliminating films from the silicon substrate with a diluted anhydrous hydrogen fluoride gas of very little moisture, following steps are to be taken in order.

First, the chamber 3 is charged with a wafer. Valves 11, 12, 13, 14, 17, 18, 19, 20, 21, 23, 24, 26, 27 and 28 are opened. A high purity nitrogen in the cylinder 2 is let flow in the ratio of 1 /min., thereby lowering the concentration of moisture inside the system. It is to be confirmed by the dew-point meter 4 that the concentration of moisture is not more than 10 vppm. Valves 20, 23, 26, 27 and 27 are closed, while opening valves 25, 31 and 32 to let the high purity nitrogen flow into the IR cell 5. Valves 15 and 16 are opened while closing the valves 13 and 14 to produce a diluted high purity anhydrous hydrogen fluoride gas, whose concentration of hydrogen fluoride is analyzed by the IR.

The valves 20 and 23 are then opened while closing the valves 21 and 24 so that the diluted high purity anhydrous hydrogen fluoride gas flows into the chamber. The gas reactive with oxide film is let flow into the IR cell and analyzed there.

The valves 13 and 14 are opened while closing the valves 15 and 16 to substitute the diluted anhydrous hydrogen fluoride gas remained in the system with the high purity nitrogen. For operating the system continuously, it is recommended that the inert gas is left flowing into the processing chamber 3 at all times, and the diluted anhydrous hydrogen fluoride gas is switched on to flow every time semiconductor substrate is delivered to the processing chamber by a load lock mechanism. For eliminating films containing a large amount of metallic impurities, it is preferred that a certain amount of chlorine gas is mixed with the diluted anhydrous hydrogen fluoride gas.

Figure 2:
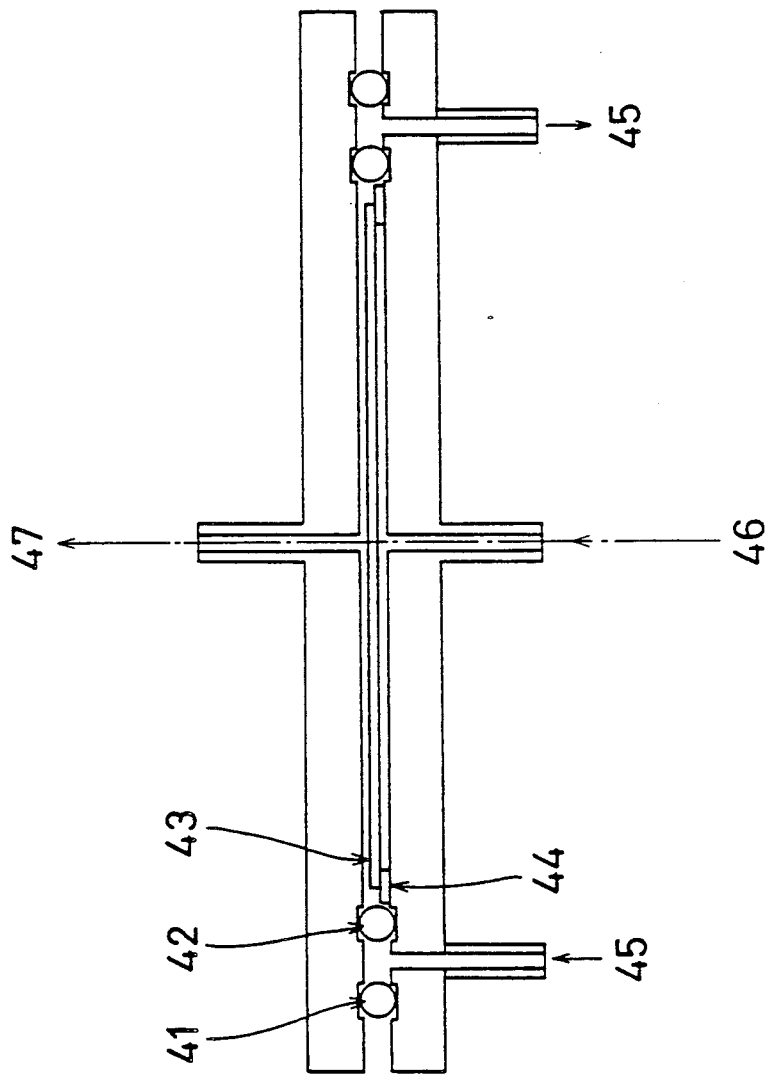
FIG. 2 is a view showing a chamber made of nickel.
Figure 3:
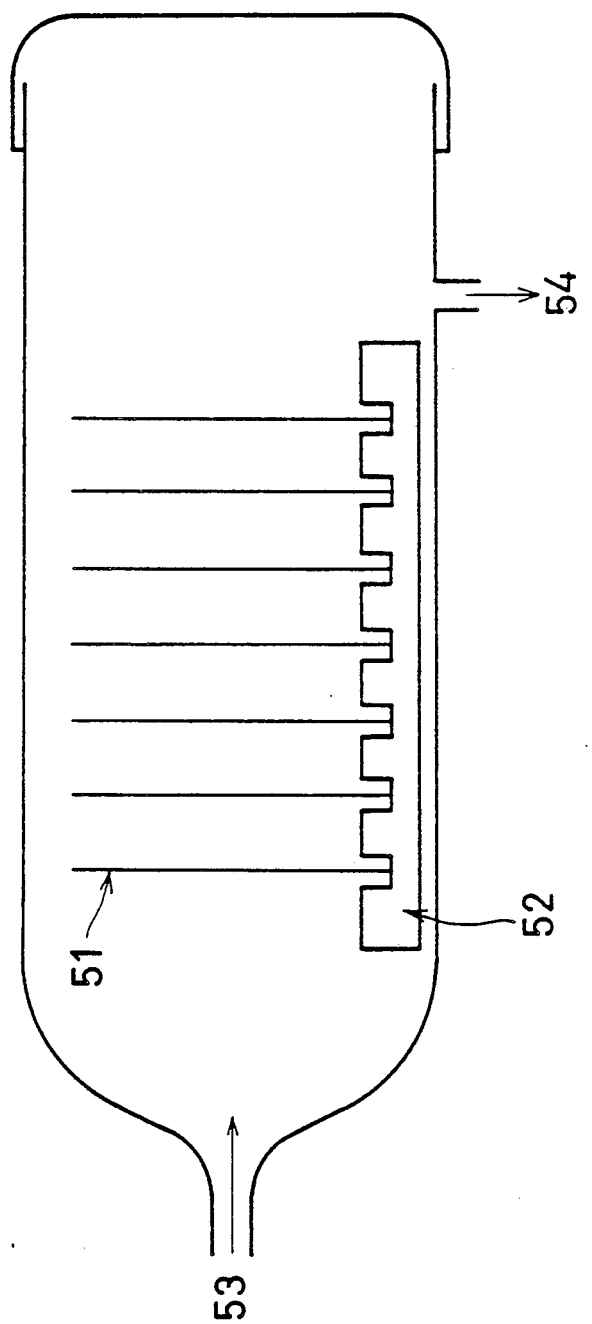
FIG. 3 is a view showing a leaf-shaped chamber made of silica.

In this connection, the chamber 3 can be also formed into a double-seal structure comprising a packing of fluoric material diposed outside and a gasket of metal diposed inside so that the high purity nitrogen may flow through the internal part therebetween, as shown in FIG. 2. It is not always necessary to adopt such a structure, but the structure is desirable in view of securing an extremely low moisture area.

Results obtained from various analyses by using the IR as a monitor are described hereinafter.

Figure 4:
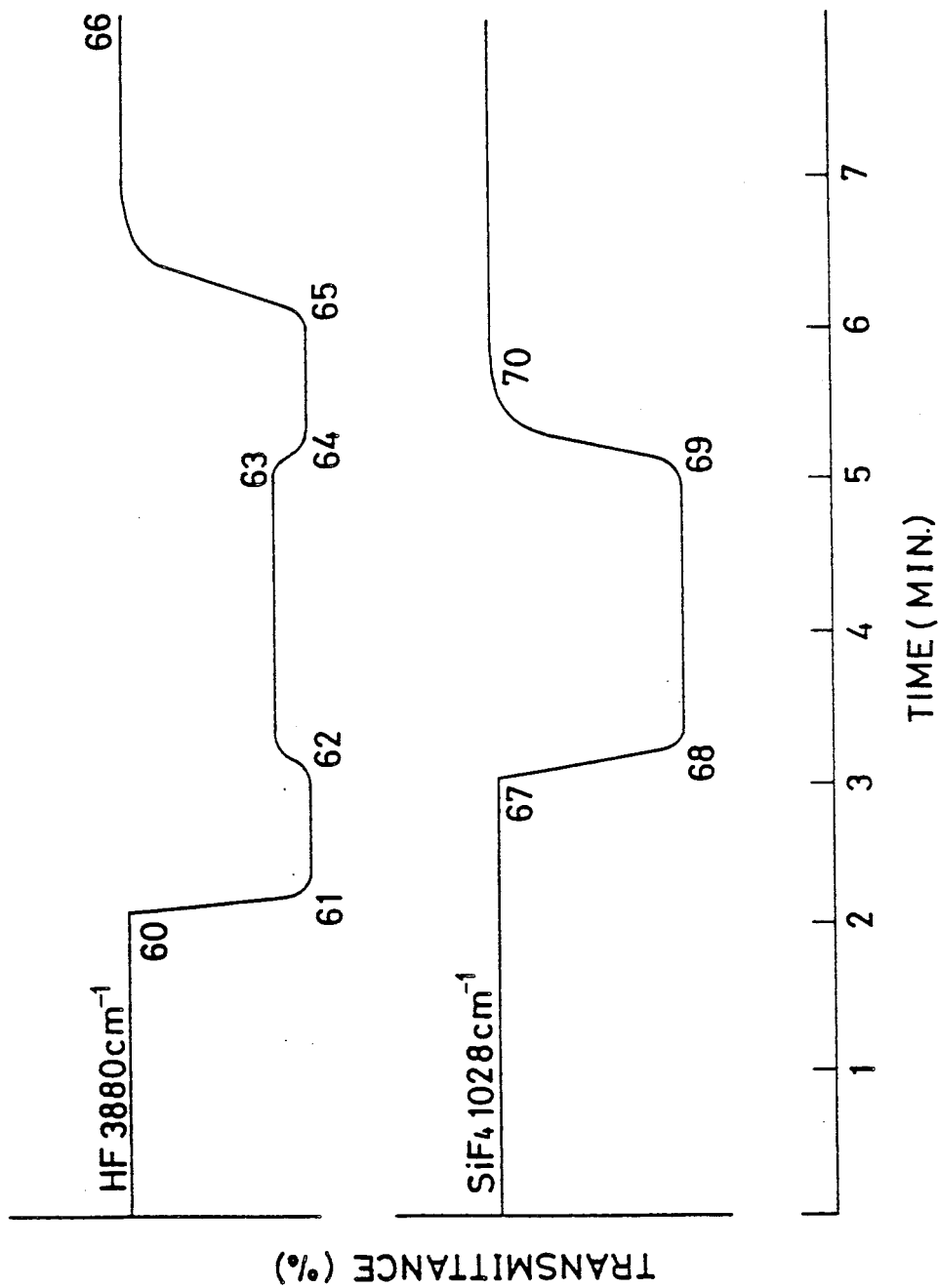
FIG. 4 is an IR monitor diagram of a diluted anhydrous hydrogen fluoride gas serving as a reaction gas (upper line) and a silicon tetrafluoride gas being produced by reaction (lower line)

Upper line in FIG. 4 shows a chart of the concentration of hydrogen fluoride continuously measured with the passage of time in which wave number is fixed to 3880 cm, and from which concentration of hydrogen fluoride is seen in the form of transmittance. In this drawing, supply of diluted anhydrous hydrogen fluoride gas begins at the point 60. At this time, the gas is supplied not to the processing chamber but to the IR through by-pass. Concentration of hydrogen fluoride is recognized from the height between the points 60 and 61. After confirming that the diluted anhydrous hydrogen fluoride gas is constantly supplied (61-62) at a required concentration (60-61), the diluted anhydrous hydrogen fluoride gas is supplied to the chamber (62). Reaction occurs instantaneously thereby starting etching of film (62), which is completed at the point 63. When dividing film thickness by the time required for etching (62-63), etching rate can be obtained. When completing the film etching, the diluted anhydrous hydrogen fluoride gas returns to its original concentration (64). After confirming that next film etching has not occurred yet (64-65), supply of the diluted anhydrous hydrogen fluoride gas is stopped.

Lower line in FIG. 4 was obtained by continuously measuring a silicon tetrafluoride gas produced by reaction between oxide film and diluted an hydrous fluoride gas when fixing wave number to 1028.

Referring to the lower line in FIG. 4, when starting supply of the diluted anhydrous hydrogen fluoride gas to the chamber (67). a silicon tetrafluoride gas is immediately generated (67-70). In FIG. 4, numerals 62 and 67 indicate respectively supply starting points of the diluted anhydrous hydrogen fluoride gas, and numerals 63 and 69 indicate corresponding supply stop points thereof. The larger the film surface area is, the larger the area surrounded by 67-70 is, and the larger the film thickness is, the longer the time for 68-69 is. Film etching rate can be obtained by dividing the amount of variation of transmittance (67-68-69-70) by the time required for film etching (67-69). Thus, FIG. 4 shows IR monitor curves when thermal oxide $SiO_2$ film (whose thickness is 9645 Å and are is 1.86 cm$^2$) is etched with 2 v % concentration of hydrogen fluoride.

Figure 5:
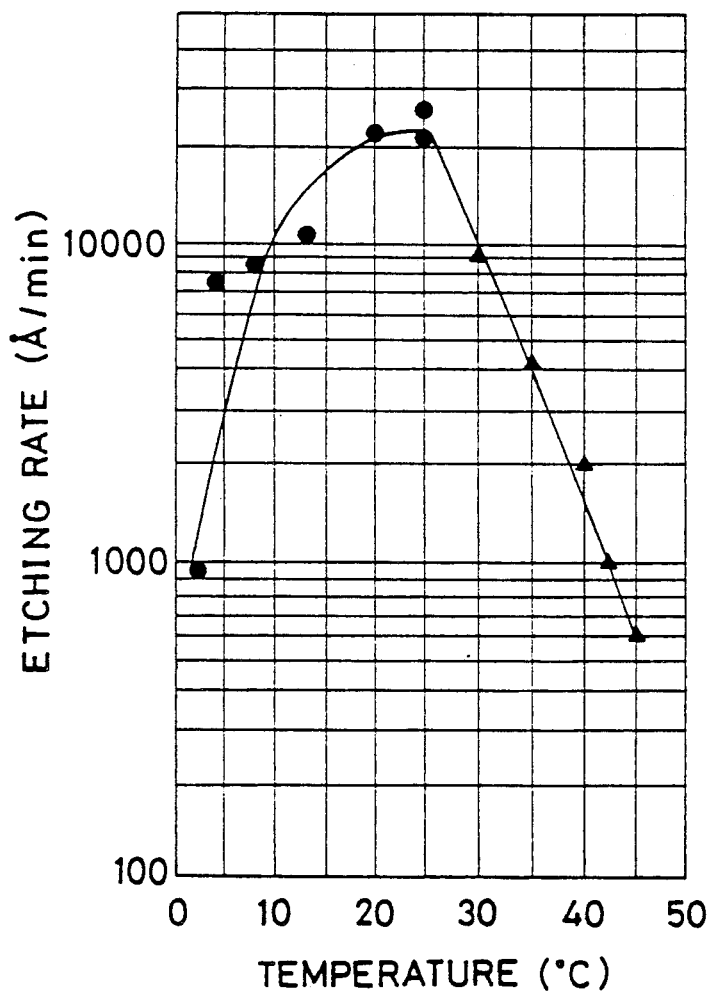
FIG. 5 is a diagram showing etching rate of a thermal oxide film in relation to temperature of the diluted anhydrous hydrogen fluoride gas, and in which mark ● shows that the film was completely etched away and mark ▲ shows that the film was just partially etched.

Film etching rate and film etching ratio in relation to temperature were then obtained. FIG. 5 shows a result of etching of silicon thermal oxide film by supplying 4.7 v % diluted anhydrous hydrogen fluoride to the chamber at the flow rate of 1 l/min. while changing temperature. Concentration of moisture ($H_2O$) in the chamber was 1 vppm in this process. It was found from this Figure that the film etching rate is maximum in the vicinity of 25° C., slowing down on both low and high temperature sides.

Figure 6:
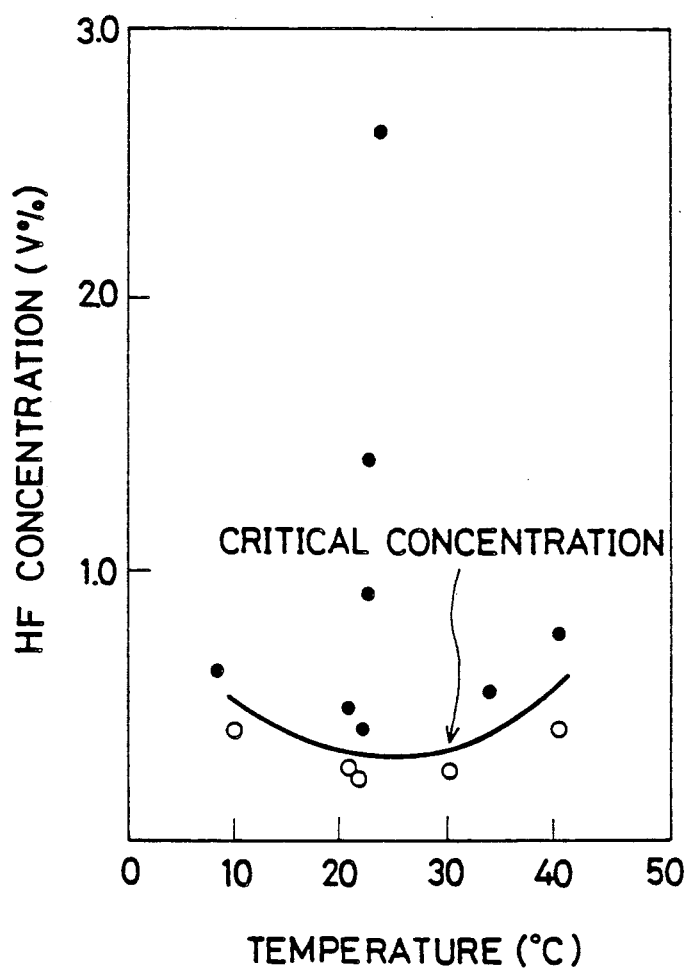
FIG. 6 is a diagram showing a relation between minimum value of concentration of hydrogen fluoride where etching of native oxide film occurs and temperature, and in which mark ● shows that the film was completely etched away and mark ○ showing that the film was just partially etched.

FIG. 6 shows minimum concentration of hydrogen fluoride required for occurrence of reaction concerning native oxide film. A curve in the drawing indicates a critical concentration of the hydrogen fluoride concentration showing whether the reaction takes place or not.

It was found from this diagram that the native oxide film is most reactive also in the vicinity of 25° C. The same results were obtained concerning the other films.

Figure 7:
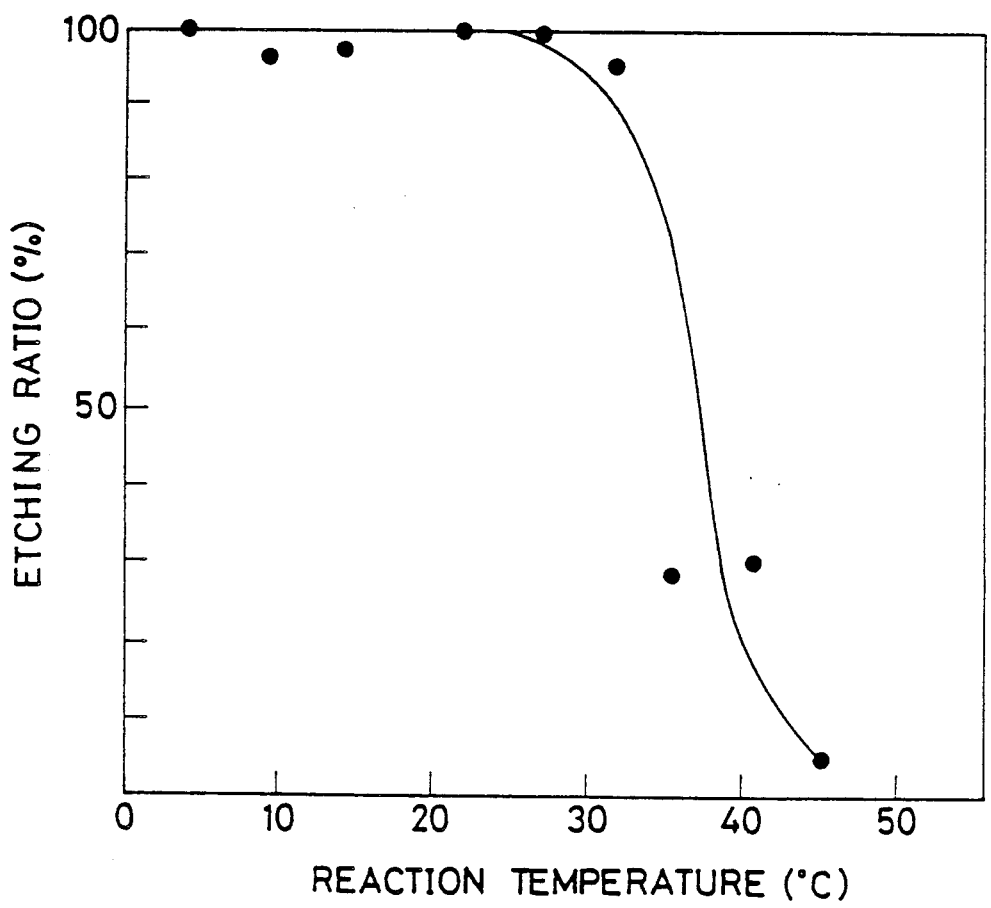
FIG. 7 is a diagram showing film etching ratio of thermal oxide film in relation to temperature.

FIG. 7 shows film etching rate of thermal oxide film in relation to temperature. The film can be etched away perfectly (100%) under 25° C., but the film etching rate goes down with increase of temperature. Film etching rate is losed when temperature is over 45° C. Accordingly, it is essential for the processing chamber of the apparatus to be kept at a temperature not higher than 45° C.

It is acknowledged from FIGS. 5, 6 and 7 that the film etching rate is maximum at the temperature in the vicinity of 25° C. permitting rapid etching of films. In the lower temperature area, though the films can be completely etched away, film etching rate is slow down taking long time in the etching. On the other hand, in the higher temperature area, the higher the temperature is, the slower the film etching rate is, and moreover the films cannot be completely etched away leaving some residual portions. As a result, it is preferable to carry out the film film at the temperature of about 25° C.

Table 1 shows conditions of formation of various $SiO_2$ films and processing conditions thereof. Film etching was carried out with respect to each of the films by changing concentration of hydrogen fluoride and that of moisture ($H_2O$).

TABLE 1

| Kind of film | Formation conditions | Processing conditions | Film thickness (Å) |
| --- | --- | --- | --- |
| Thermal oxide film | $O_2:H_2 = 4:6$ 950–1000° C. | | 9645 |
| Thermal oxide film | 1000° C., processing for 1 hour | | 1200 |
| CVD film | 400° C. | | 4000–5000 |
| BSG film | $B_2H_6/SiH_4 = 1/5$ 300° C. | 1050° C. for 30 min. | 4000–5000 |
| BSG film | $B_2H_6/SiH_4 = 1/10$ 300° C. | 1050° C. for 30 min. | 4000–5000 |
| BSG film | $B_2H_6/SiH_4 = 1/20$ 300° C. | 1050° C. for 30 min. | 4000–5000 |
| PSG film | $PH_3/SiH_4 = 1/5$ 300° C. | 1050° C. for 30 min. | 4000–5000 |
| PSG film | $PH_3/SiH_4 = 1/10$ 300° C. | 1050° C. for 30 min. | 4000–5000 |
| PSG film | $PH_3/SiH_4 = 1/20$ 300° C. | 1050° C. for 30 min. | 4000–5000 |
| Native oxide film | 30% $H_2O_2$ 70° C. processing for 1 hour Pt catalyzer | | 6 |
| Native oxide film | $HNO_3$ 70° C. processing for 5 min. | | 6 |
| Native oxide film | $O_3$ processing for 1 hour low pressure mercury lamp | | 11 |
| Native oxide film | hot air drying | | 6 |

Figure 8:
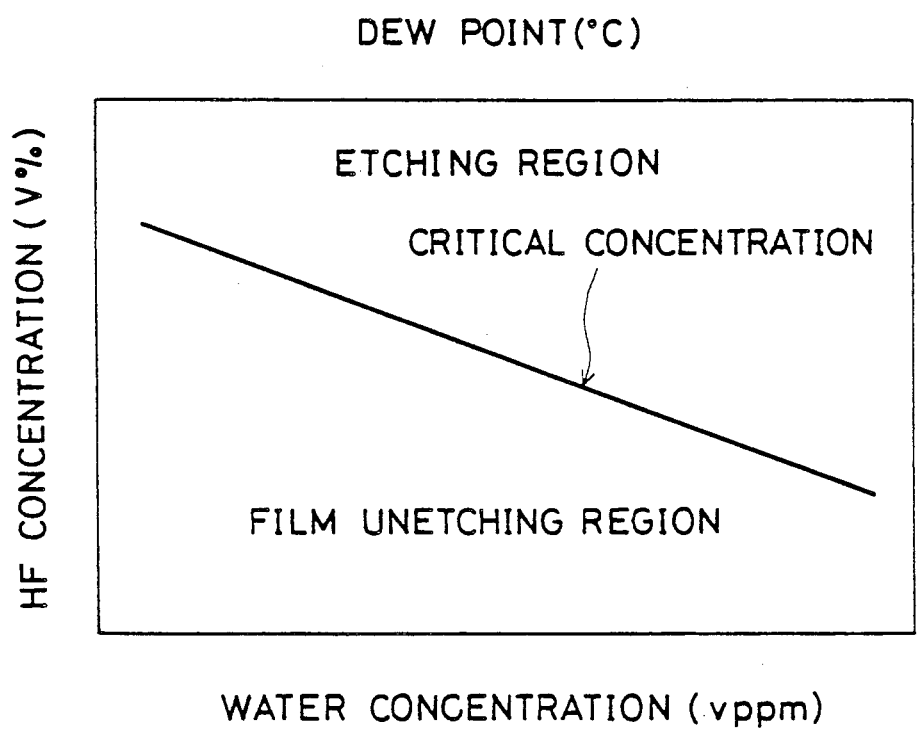
FIG. 8 is a diagram showing a model of critical line between the area in which film is etched and the area in which film is not etched.

The reaction takes place at a certain level of concentration of hydrogen fluoride and that of moisture ($H_2O$), and does not take place at all when those concentrations are lower than that level. In other words, whether or not the reaction takes place is clearly distictive putting a boundary of concentration therebetween. The boundary is herein called the "critical concentration", and FIG. 8 shows a model thereof. In FIG. 8, axis of ordinates indicates concentration of hydrogen fluoride (v %) contained in the inert gas, and axis of abscissa indicates concentration of moisture (V %). As seen from this model, film is etched in the upper area of the critical concentration, while no film is etched in the lower area thereof. The film etching area was determined whether or not a film was etched by applying a certain concentration of diluted anhydrous hydrogen fluoride gas for 30 minutes. As the result, it was found that the film was instantaneously etched in the film etching area (i.e., upper area of the critical concentration) while no film being etched in the film unetching area (i.e., lower area of the critical concentration) after passing 30 minutes. The critical concentration varies depending on the conditions of oxide film formation on a substrate and processing conditions.

Critical concentrations for various oxide films were obtained, and FIGS. 9 to 13 show the results, in which reaction temperature was 20° C.

Figure 9:
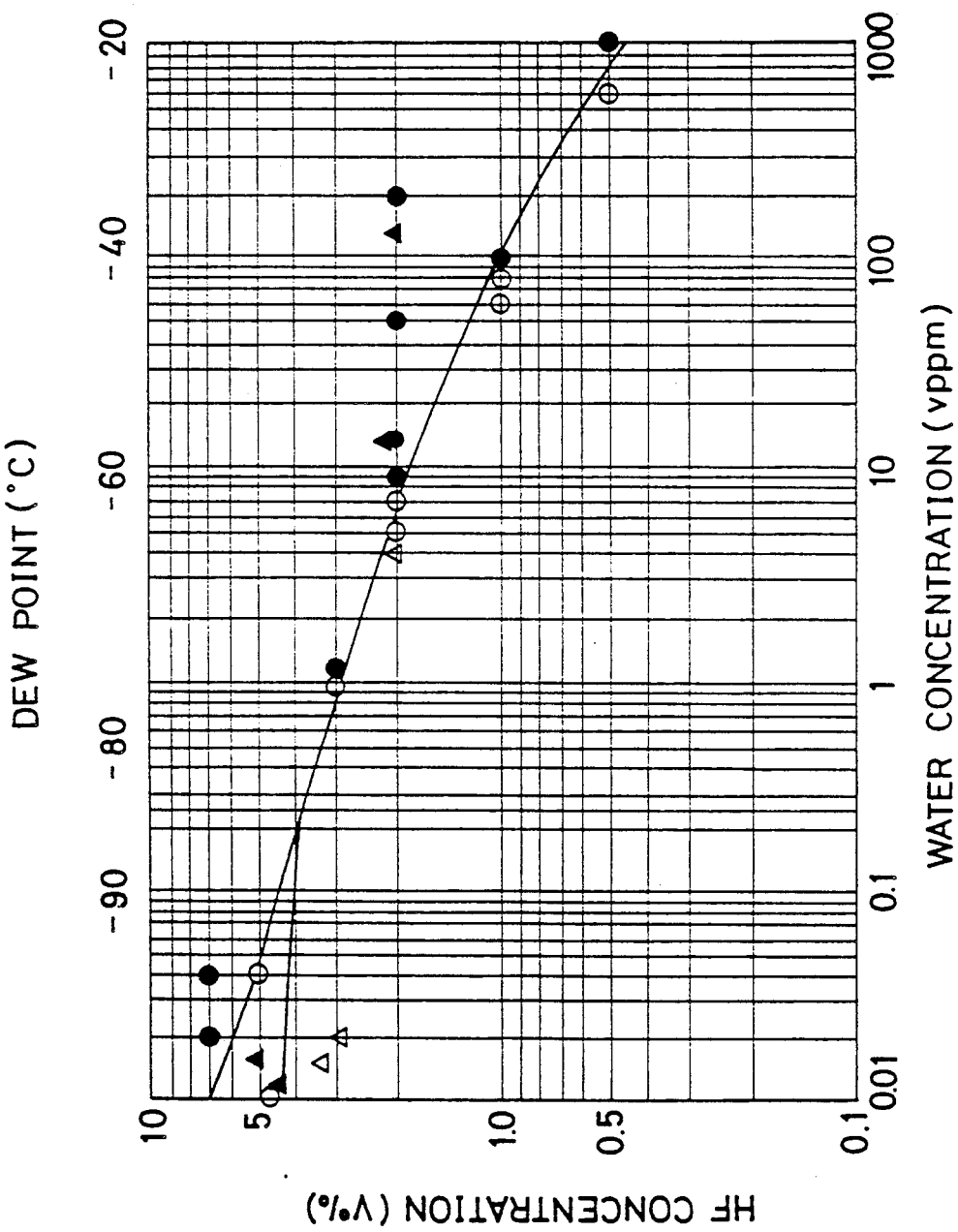
FIG. 9 is a diagram to obtain the critical line of etching of thermal oxide films formed under different conditions, when reaction temperature is 20° C. and flow rate of diluted anhydrous hydrogen fluoride gas is 1 l/min. Concerning a wet thermal oxide film to which heating ($O_2:H_2=4:6$) was applied in the temperature range of 950° to 1000° C., mark ● shows that the film was completely etched away, and mark ○ shows that no film was etched at all. Concerning a dry thermal oxide film heat-treated at 1100° C. for one hour, mark ▲ shows that the film was completely etched away, and mark △ shows that the film was not etched at all.

FIG. 9 shows an example of thermal oxide film, and in which critical concentration varies in the lower moisture area due to difference in film formation conditions. It was found that a film formed by wet oxidation method is more difficult to be etched than that formed by dry oxidation method under the same concentration of $H_2O$. For example, when concentration of $H_2O$ was 0.04 vppm and that of hydrogen fluoride was 5 v %, no film formed by wet oxidation was etched but film formed by dry oxidation was etched away. However, in the area whose concentration of $H_2O$ is higher than 0.2 vppm, critical concentrations of the two films were coincident with each other.

Figure 10:
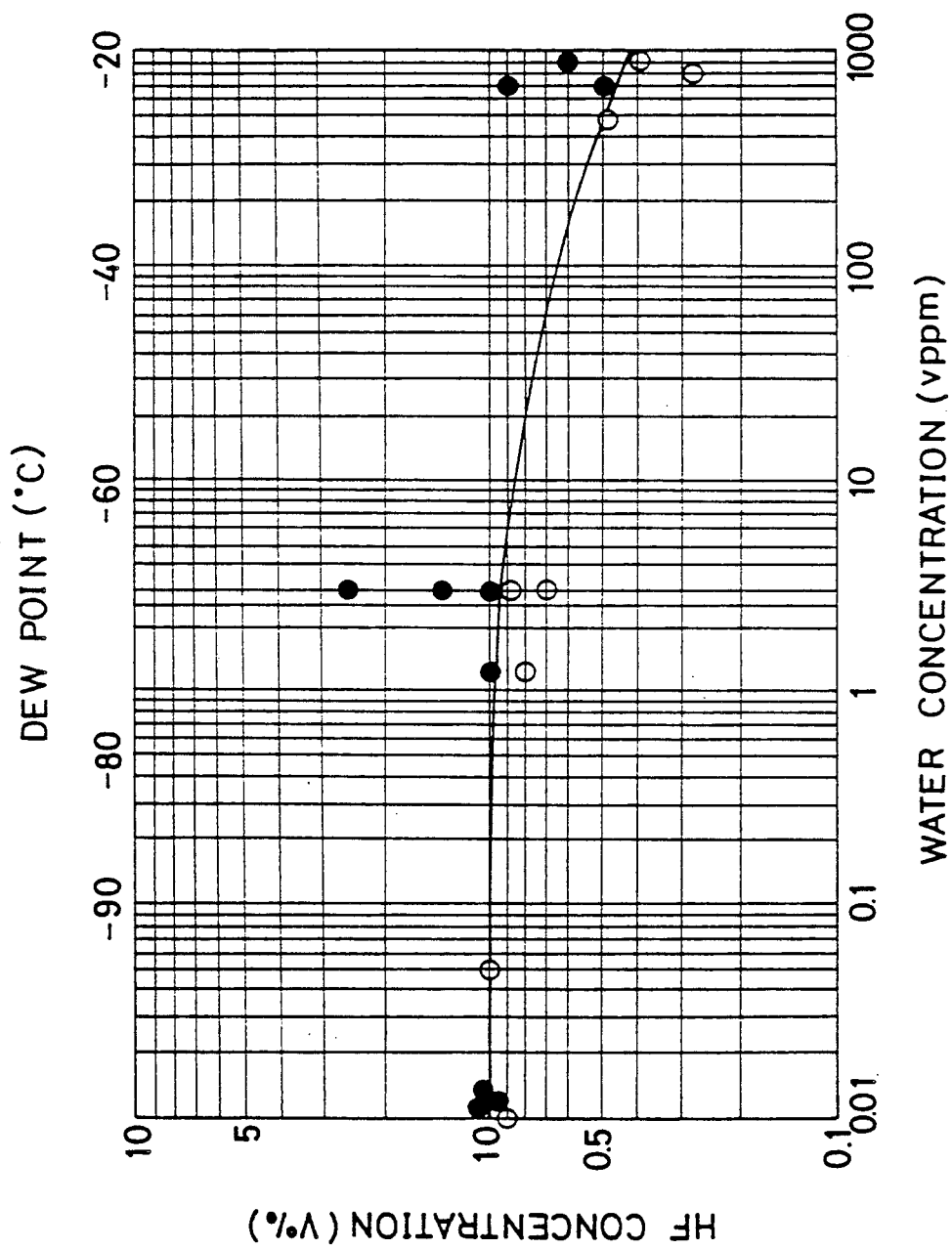
FIG. 10 is a diagram to obtain the critical line of etching of a CVD film when reaction temperature is 20° C. and flow rate of diluted anhydrous hydrogen fluoride gas is 1 l/min. The CVD film was deposited at 400° C., and mark ● shows that the film was completely etched away and mark ○ shows that the film was not etched at all.

FIG. 10 shows a result obtained with respect to CVD $SiO_2$ film, and in which critical concentration of diluted anhydrous hydrogen fluoride gas was almost constantly 0.9 to 1.0 v % when concentration of $H_2O$ was less than several ppm. On the other hand, in the higher moisture area, concentration of hydrogen fluoride was sharply lowered with increase of concentration of $H_2O$.

Figure 11:
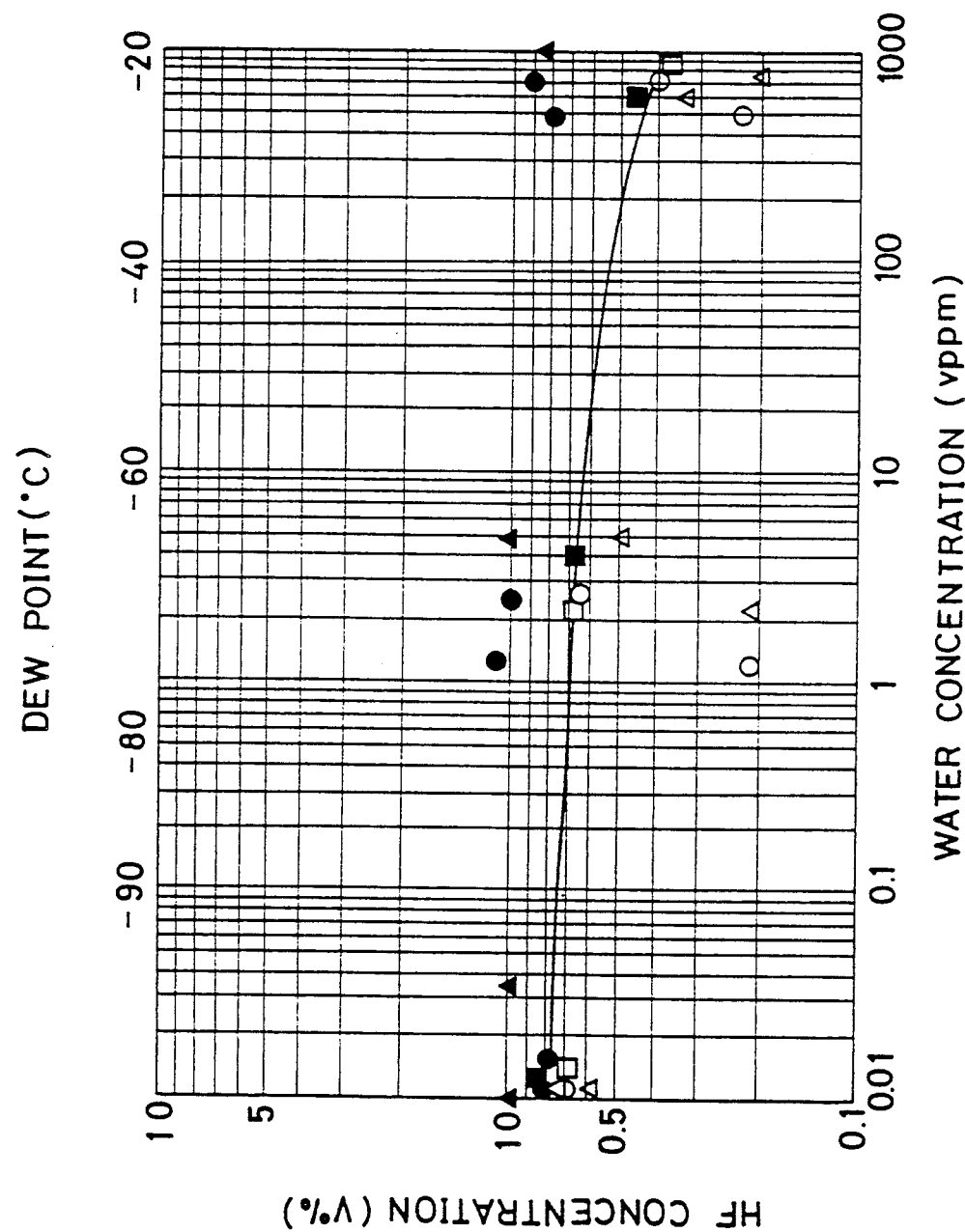
FIG. 11 is a diagram to obtain the critical line of etching of BSG films formed under different conditions, when reaction temperature is 20° C. and flow rate of diluted anhydrous hydrogen fluoride gas is 1 l/min. Concerning a BSG film which was doped at 300° C. under the gas ratio of $B_2H_6/SiH_4=1/5$ then heat-treated at 1050° C. for 30 minutes, mark ■ shows that the film was completely etched away, and mark □ shows that the film was not etched at all. Concerning another BSG film which was doped at 300° C. under the gas ratio of $B_2H_6/SiH_4=1/10$ then heat-treated at 1050° C. for 30 minutes, mark ● shows that the film was completely etched away, and mark ○ shows that the film was not etched at all. Concerning a further BSG film which was doped at 300° C. under the gas ratio of $B_2H_6/SiH_4=1/20$ then heat-treated at 1050° C. for 30 minutes, mark ▲ shows that the film was completely etched away and mark △ shows that the film was not etched at all.

FIG. 11 shows a result of CVD $SiO_2$ film (BSG film) to which boron was doped. The test was carried out on a film formed by changing the doping amount of boron. The result was, however, that critical concentration was not substantially influenced by the doping amount.

Figure 12:
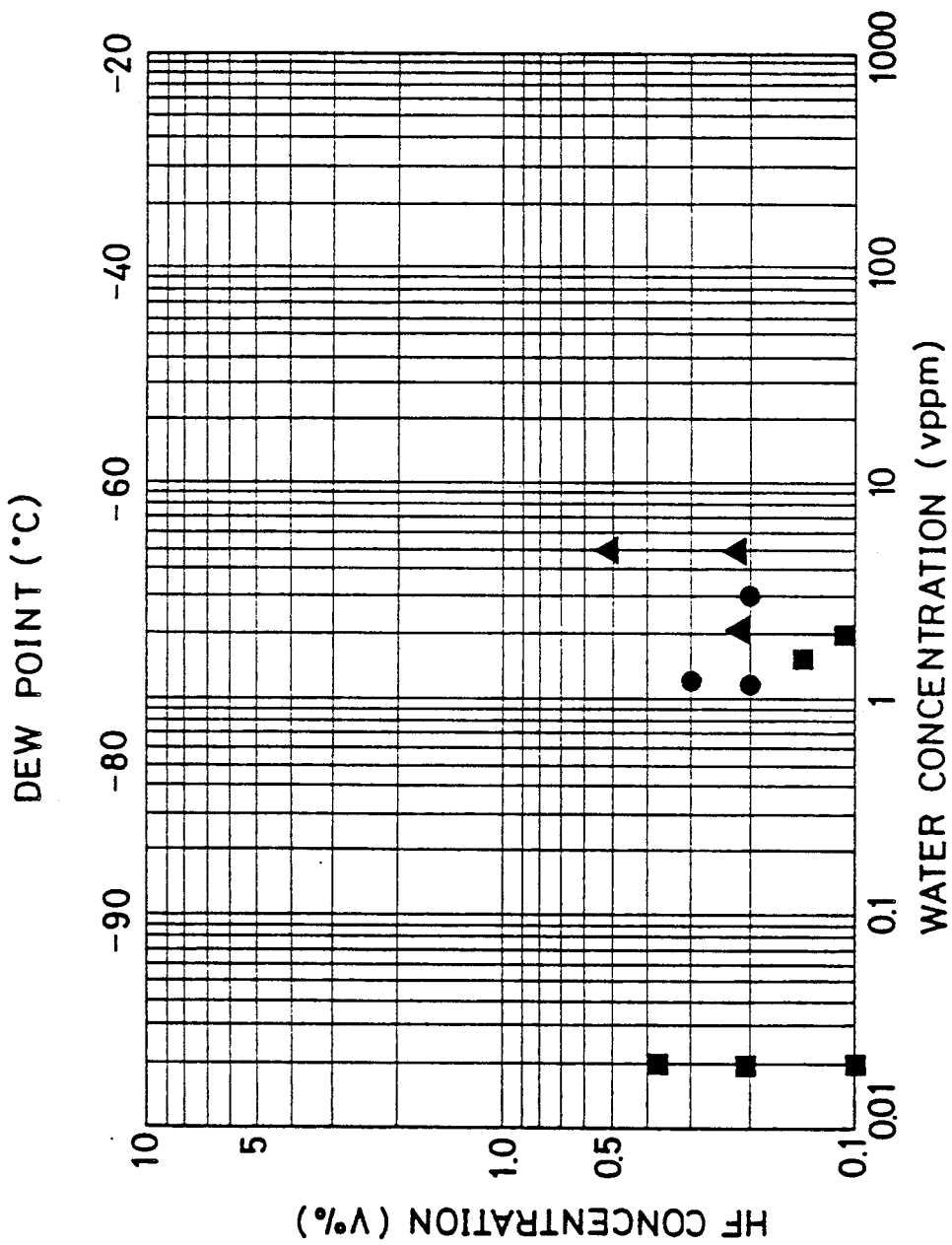
FIG. 12 is a diagram to obtain the critical line of etching of PSG films formed under different conditions, when reaction temperature is 20° C. and flow rate of diluted anhydrous hydrogen fluoride gas is 1 l/min. Concerning a PSG film which was doped at 300° C. under the gas ratio of $PH_3/SiH_4=1/5$ then heat-treated at 1050° C. for 30 minutes, mark ▲ shows that the film was completely etched away, and mark △ shows that the film was not etched at all. Concerning another PSG film which was doped at 300° C. under the gas ratio of $PH_3/SiH_4=1/10$ then heat-treated at 1050° C. for 30 minutes, mark ● shows that the film was completely etched away, and mark ○ shows that the film was not etched at all. Concerning a further PSG film which was doped at 300° C. under the gas ratio of $PH_3/SiH_4=1/20$ then heat-treated at 1050° C. for 30 minutes, mark ■ shows that the film was completely etched away, and mark □ shows that the film was not etched at all.

FIG. 12 shows a test result of CVD $SiO_2$ film (PSG film) to which phosphorus was doped. It was found that film was etched away even when concentration of hydrogen fluoride was 0.1 v %, and there was found no area where film was not etched.

Figure 13:
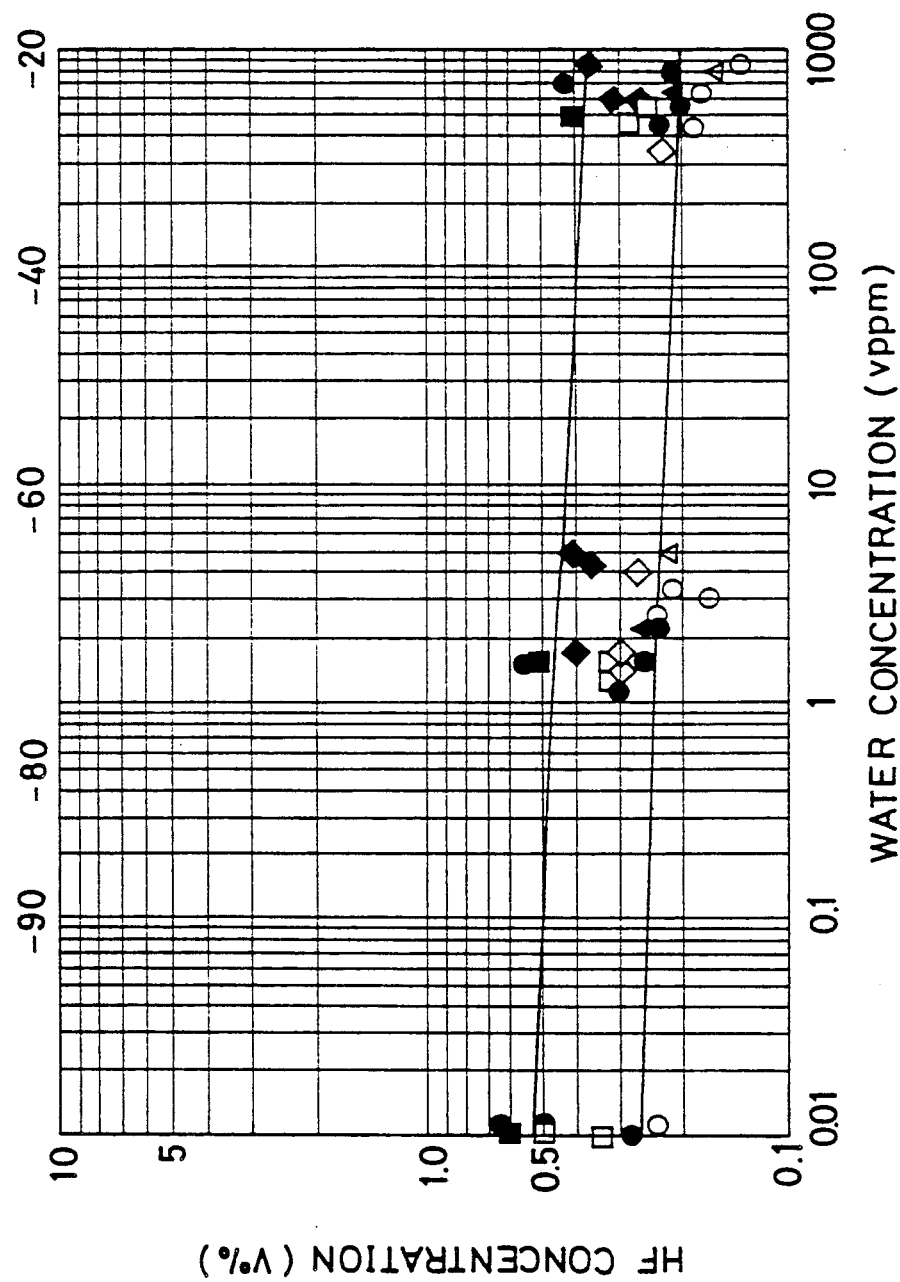
FIG. 13 is a diagram to obtain the critical line of etching of natural oxide films formed under different conditions, when reaction temperature is 20° C. and flow rate of diluted anhydrous hydrogen fluoride gas is 1 l/min. Concerning a natural oxide film which was treated with $O_3$ for one hour by means of a low pressure mercury lamp, mark ● shows that the film was completely eliminated, and mark ○ shows that the film was not eliminated at all. Concerning another natural oxide film which was dried with hot air, mark ■ shows that the film was completely etched away, and mark □ shows that the film was not etched at all. Concerning a further natural oxide film which was treated with $HNO_3$ at 70° C. for 5 minutes, mark ▲ shows that the film was etched away eliminated, and mark △ shows that the film was not etched at all. Concerning a still further natural oxide film which was treated with 30% $H_2O_2$ at 70° C. for one hour, mark ◆ shows that the film was completely etched away, and mark ◇ shows that the film was not etched at all.

FIG. 13 shows a critical line obtained with respect to native oxide films including a native oxide film formed by $O_3$, another native oxide film subject to hot-air drying and a further native oxide film formed by chemical treatment (with $HNO_3$, $H_2O_2$). The result was that the film formed by $O_3$ was more reactive than the remaining two native oxide films.

Figure 14:
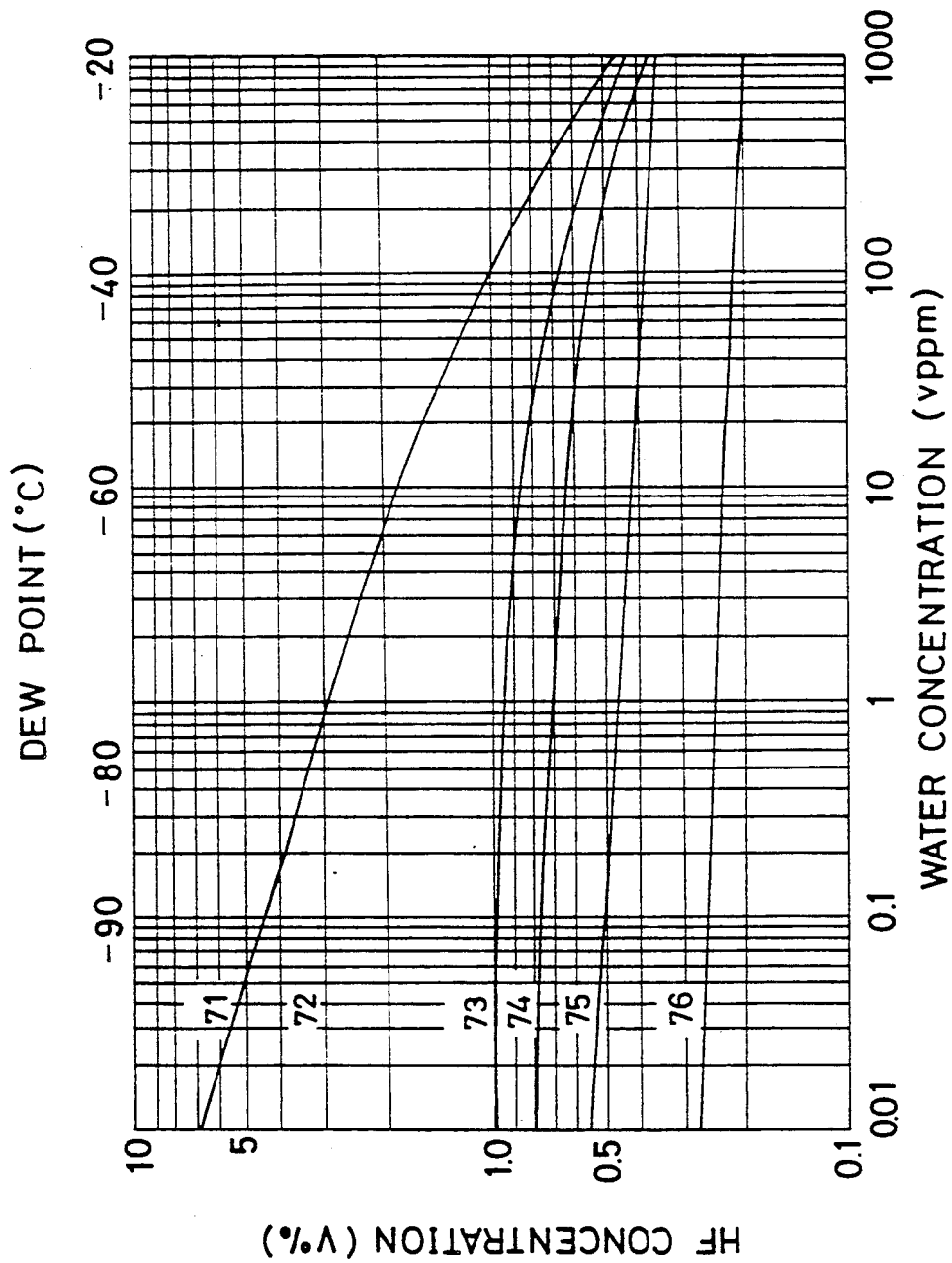
FIG. 14 is a diagram showing collectively the critical lines of etching of the foregoing various films, when reaction temperature is 20° C. and flow rate of diluted anhydrous hydrogen fluoride gas is 1 l/min.

FIG. 14 collectively shows the critical concentrations in FIGS. 9 to 13.

In FIG. 14, from top to bottom, the critical concentrations of thermal oxide film, CVD film, BSG film and native oxide film are shown in order, and it is noted that the critical line of PSG film is less than 0.1 v %.

Figure 15:
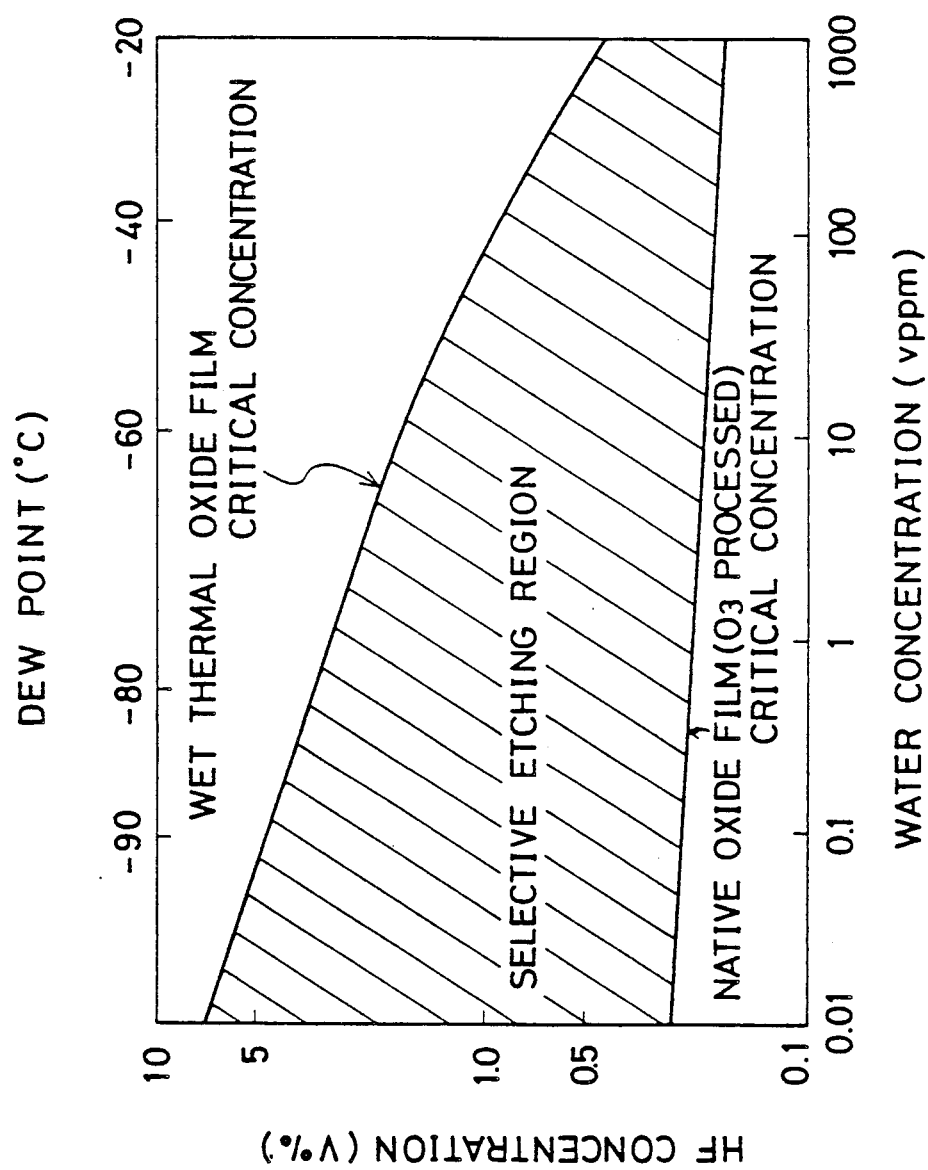
FIG. 15 is a diagram showing the selective etching area the thermal oxide film and native oxide film, when reaction temperature is 20° C. and flow rate of diluted anhydrous hydrogen fluoride gas is 1 l/min.

FIG. 15 shows an area in which native oxide film alone is selectively etched when both thermal oxide film and native oxide film (ozonated) exist together. In other words, only native oxide film is selected to be etched without etching of thermal oxide film by utilizing the hatched area in FIG. 15.

It is possible to carry out such selective etching with respect to any combination of the oxide films in FIG. 14 other than the foregoing combination of thermal oxide one and native oxide one shown in FIG. 15. For example, PSG film alone can be etched from the combination of CVD and PSG films. It is also allowed to carry out such selective eching from among more than two films forming a further combination. For example, native oxide film alone can be selectively eched from a complex of thermal oxide film, CVD film and native oxide film or from another complex of thermal oxide film, BSG film and native oxide film. PSG film alone can be also etched from a complex of thermal oxide film, CVD film and PSG film.

In the area of rather high $H_2O$ concentration, however, etching of film takes place even with a diluted anhydrous hydrogen fluoride gas of rather low concentration, and selective etching of thermal oxide film, CVD film, native oxide film or other film becomes difficult. For example, establishing that the concentration of $H_2O$ is 1000 vppm, critical concentration of thermal oxide film comes when concentration of hydrogen fluoride is 0.45%, critical concentration of native oxide film formed by hot-air drying comes when concentration of hydrogen fluoride is 0.35%, and critical concentration of thermal native film formed by $O_3$ comes when concentration of hydrogen fluoride is 0.2%. Critical concentration of CVD and BSG films are positioned in intermediate percentages of concentration of hydrogen fluoride. Controllable range of concentration of hydrogen fluoride is +0.15% at present, and accordingly selective etching of film by controlling concentration of hydrogen fluoride is difficult in the high moisture area in which concentration of $H_2O$ mounts to 1000 vppm, for example. When concentration of moisture is less than 10 vppm, the critical concentrations for etching of thermal oxide film, CVD film, BSG film, native oxide film and PSG film are respectively less than 1.8%, 0.9%, 0.65%, 0.4% and 0.1% which are over the controllable range of concentration of hydrogen fluoride, which means that selective etching of film is possible.

At least one anhydrous inert gas is picked up among nitrogen, helium and argon. In addition to nitrogen, helium and argon each serving as a carrier gas, a hydrogen gas easy to obtain ultra high purity gas is preferably used to achieve the same performance.

The substrates to be treated by the dry etching device in accordance with the invention are wafers which are, for example, sometimes composed of silicon, polysilicon, garnet, binary (two-component) composition such as gallium arsennide or indium phosphide, ternary (three-component) composition such as Cd-Hg-Te, Ga-Al-As or Ga-In-P, and quaternary (four-component) composition such as Ga-In-As-P.

The pipe line for supplying diluted anhydrous hydrogen fluoride gas can be made of stainless steel or nickel capable of preventing the pipe line from leak outside.

The processing chamber can be also made of metal such as nickel, stainless steel, etc., silica or ceramics, and therefore an apparatus without leak outside at all can be constructed. Accordingly, moisture adsorped in the internal surface of the apparatus can be rapidly desorbed, thereby allowing the selective etching of film in the extremely low moisture area.

Figure 16:
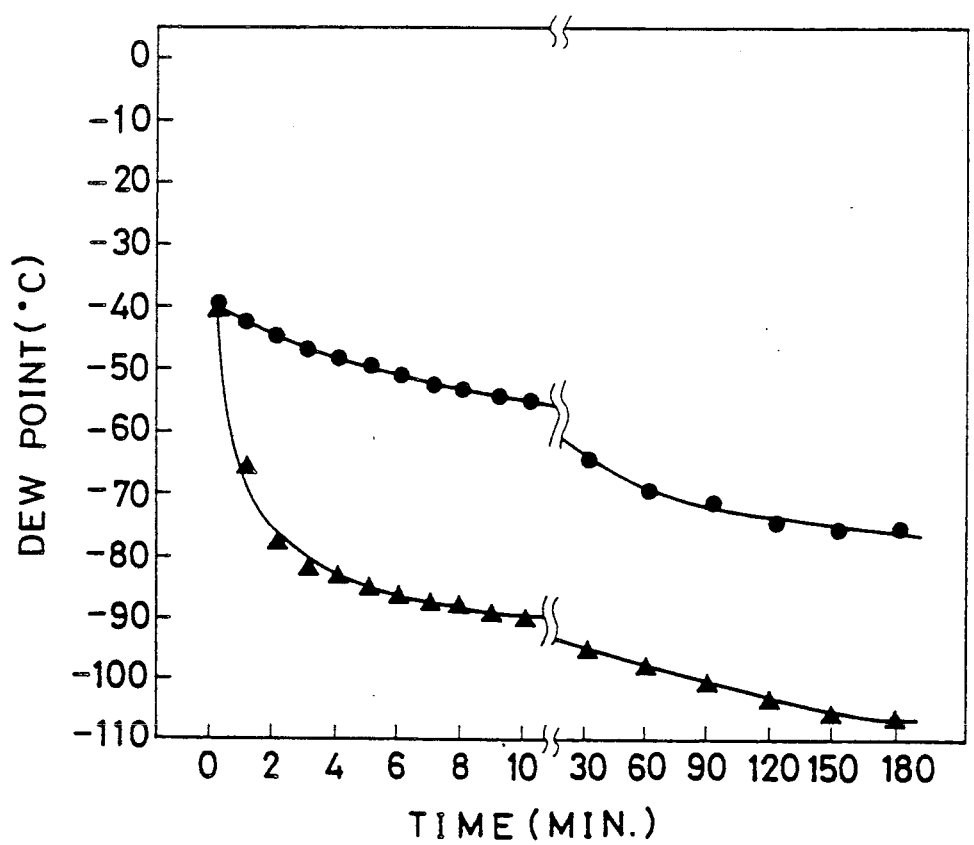
FIG. 16 is a diagram showing a comparison between a pipe line of metal and that of fluororesin in the aspect of variation in dehydration inside the pipe lines with the passage of time, and in which mark ▲ indicates pipe line made of stainless steel and chamber of nickel, and mark ● indicate pipe line and chamber of PFA.

In order to confirm the moisture adsorbed to the inner wall of the pipe line, a high purity nitrogen was supplied to flow through the pipe line. After dew point coming to $-105°$ C., the pipe line was left closed for 10 hours. Then the high purity nitrogen was again supplied to flow therethrough. As a result of measurment of desorbed moisture, it was found that the dew point was slightly raised only to $-96°$ C., thus it was confirmed that moisture adsorbed to the innner wall of the pipe line was very small. In the nickel chamber, it was found that moisture increased in the dew point range of $-105°$ C. to $-85°$ C. when wafer was actually placed. Comparing a nickel chamber with a PFA chamber in the aspect of variation of moisture desorption in the reaction system with the lapse of time by flowing high purity nitrogen after releasing the chambers for long time until the dew point was raised to $-40°$ C., it was found that the dew point of the nickel chamber decreased to $-90°$ C. in a few minutes, while that of the PFA chamber decreased to $-70°$ C. even after three hours. FIG. 16 shows the result, and in which mark ● indicates the pipe line and chamber made of PFA and Mark ▲ indicates the pipe line and chamber made of nickel. In this manner, an area of very little moisture impossible to achieve by employing polymer resin or fluororesin can be now obtained by employing a supply pipe line and a chamber made of metal. Furthermore, as the result of employing the metallic materials, more accurate machining is achieved.

Figure 19:
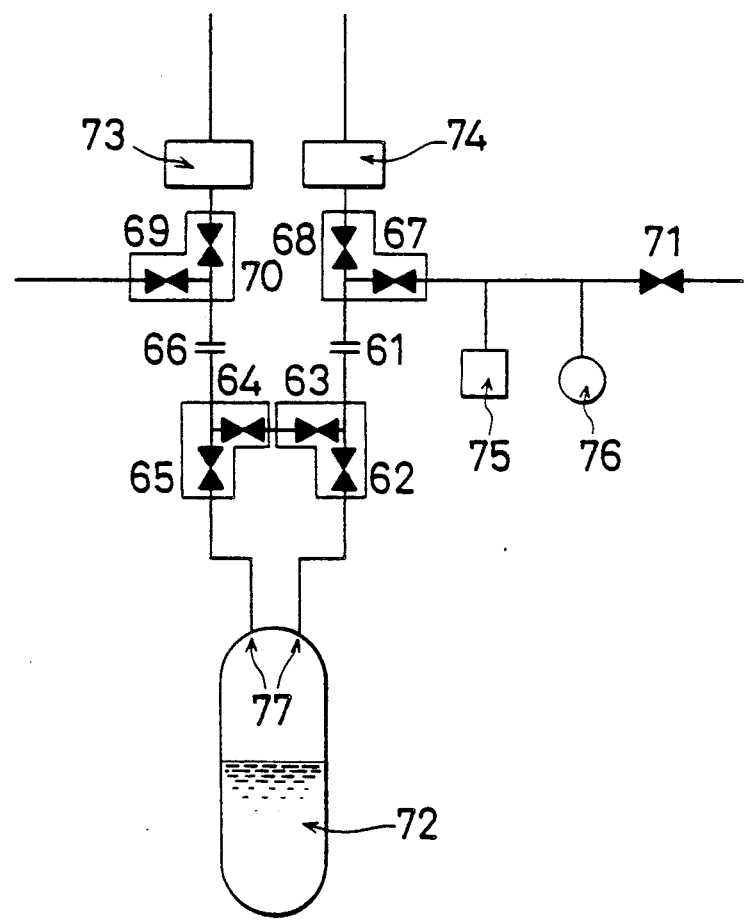
FIG. 19 is a schematic view in which a metal container of the diluted anhydrous hydrogen fluoride gas generator is filled with liquefied anhydrous hydrogen fluoride gas.

Referring now to FIG. 19 showing a schematic diagram of the diluted anhydrous hydrogen fluoride gas generator whose metal container is going to be filled with a liquefied anhydrous hydrogen fluoride, the container 72 of the diluted anhydrous hydrogen fluoride gas generator is made of metal and provided with the inlet 61 and the outlet 66 both for inert gas, and the pressure gauge 76, the conductivity measurement 74 and dew point meter 73 are respectively attached to the inlet 61 and outlet 66 at the time of filling with a liquefied anhydrous hydrogen fluoride. Further, a by-pass is disposed between the inlet 61 and the outlet 66 and provided with valves 63, 64 so as to be used for cleaning the pipe line with liquefied anhydrous hydrogen fluoride at the time of filling the container 72 with it.

Described hereinafter are the steps of filling the container 72 with a liquefied anhydrous hydrogen fluoride by utilizing a high purity nitrogen (whose dew point is not higher than $-105°$ C., and whose moisture is not more than 0.01 vppm).

1. Purging of internal parts of the container, pipe line and valves

A high purity nitrogen is introduced through the valve 71 opening the valves 63, 64, 67, 70, 71 while closing the valves 62, 65, 68. 69. Then, after opening the valves 62, 65 while closing the valves 63, 64, the cylinder and the pipe line are heated by a ribbon heater for 5 hours at 120° C. After cooling, purge is carried out with the high purity nitrogen until the dew-point meter 73 indicates that D.P. is $-95°$ C.

2. Leak test of the container, pipe line and valves (a) Leak test of the valve 65

A high purity nitrogen is introduced through the valve 71 closing the valves 62, 63, 64, 65, 68 while openig the valve 67. After opening the valves 62, 65, whether there is leak or not is checked with the pressure gauge 76 opening the valve 71.

(b) Leak test of the valve 62

A high purity nitrogen is introduced through the valve 71 closing the valves 63, 64, 65, 68 while openig the valves 62, 68. Applying a pressure to the cylinder, the indication of the pressure gauge 76 is brought to zero closing the valves 62 while opening the valves 63, 64. Then it is confirmed that there is no leak opening the valves 71, 63.

(c) Leak test of the entire system

A high purity nitrogen is introduced through the valve 71 closing the valves 64, 65, 68 while openig the valves 62, 63, 68. Applying a pressure to the cylinder, leak in the system is checked with a Snoop solution.

(d) Helium leak check

Leak at the joint sections and the coupling sections is checked with the helium detector 15.

3. Filling with liquefied anhydrous hydrogen fluoride

A high purity nitrogen is introduced through the valve 69 closing the valves 62, 65, 67, 70 while openig the valves 63, 64, 68, 69 (5 l/min. for 30 min.) A liquefied anhydrous hydrogen fluoride is then introduced through the valve 69 in place of the high purity nitrogen. After acknowledging with the conductivity measurement 74 that moisture is not more than 0.10 vppm, cleaning with the anhydrous hydrogen fluoride is carried out for 30 minutes opening the valves 62, 65 while closing the valve 64. Then, the container 72 is filled with the liquefied anhydrous hydrogen fluoride while confirming with the conductivity measurement 74 that moisture is not more than 0.10 vppm. After filling, the high purity nitrogen is introduced through the valve 69 and the liquid level of the liquefied anhydrous hydrogen fluoride is ajusted to be lower than the portion 77. The residual liquefied anhydrous hydrogen fluoride is discharged closing the valves 62, 65 while opening the valve 64. After the discharge, the high purity nitrogen is further introduced to carry our purging for 30 minutes, then the cylinder is removed from the valves 61, 66. The dew-point meter 73, conductivity measurement 74, pressure gauge 76 and helium detector 75 are not always necessary. However, by carrying out the filling operation using these instruments and by employing springless valves free from defects of gas accumulation, the container can be filled with a liquefied anhydrous hydrogen fluoride whose purity and moisture are in the same level as those of raw liquefied anhydrous hydrogen fluoride.

When the cooled container filled with hydrogen fluoride was continuously supplied with a high purity nitrogen at a constant speed (1 l/min. or so), balance between gas and liquid came immediately because of rapid vaporization of hydrogen fluoride, thus a diluted anhydrous hydrogen fluoride gas containing a required hydrogen fluoride was obtained. Table 4 shows a relation between concentration of hydrogen fluoride and vapor pressure at each temperature.

TABLE 4

| | Temp. (°C.) | | | | | | | |
|---|---|---|---|---|---|---|---|---|
| | 0 | −20 | −30 | −40 | −50 | −60 | −70 | −80 |
| Pres. (mmHg) | 361.9 | 155.2 | 97.2 | 59.0 | 34.7 | 18.4 | 10.4 | 3.5 |
| Conc. (V %) | 47.6 | 20.4 | 12.8 | 7.8 | 4.6 | 2.4 | 1.4 | 0.5 |

Cooling temperature of liquefied anhydrous hydrogen fluoride is freely selected in the range of 10° C. to 83° C., preferably in the range of −20° C. to −83° C., to achieve a predetermined concentration of gas.

Moisture in the gaseous phase of the liquefied anhydrous hydrogen fluoride is determined by the balance between gas and liquid of hydrogen fluoride-moisture system. Concentrations of moisture and hydrogen fluoride were obtained by changing cooling temperature of an anhydrous hydrogen film containing 1 to 10 ppm of moisture when there exists no diluted gas, then ratio of concentration between moisture and hydrogen fluoride was calculated. Table 5 shows the result of calculation.

TABLE 5

| Temp. (°C.) | Liquid phase Concentration of $H_2O$ (ppm) | Gaseous phase | | Ratio $H_2O/HF$ |
|---|---|---|---|---|
| | | Concentration | | |
| | | $H_2O$ (vppm) | HF (v %) | |
| 19.5 | 1 | 0.022 | 99.999 | 0.0022 |
| 0 | 1 | 0.013 | 99.999 | 0.0013 |
| −25.0 | 1 | 0.004 | 99.999 | 0.0004 |
| −50.0 | 1 | 0.00028 | 99.999 | 0.000028 |
| −70.0 | 1 | 0.000063 | 99.999 | 0.000006 |
| 19.5 | 10 | 0.22 | 99.999 | 0.0022 |
| 0 | 10 | 0.13 | 99.999 | 0.0013 |
| −25.0 | 10 | 0.04 | 99.999 | 0.000028 |
| 70.0 | 10 | 0.00063 | 99.999 | 0.000006 |

It is understood from the table that ratio of concentration between moisture and hydrogen fluoride is small when temperature is low and hydrogen fluoride of less moisture is generated. To be more specific, when using a liquefied anhydrous hydrogen fluoride containing 0.1 to 100 ppm, moisture in the gaseous phase is 0.0001 to 0.3 vppm.

Table 6 shows amount of moisture contained in a diluted anhydrous fluoride gas obtained by cooling a liquefied anhydrous hydrogen fluoride from −20° C. to −70° C. using a high purity nitrogen. For the purpose of comparison, Table 7 shows amount of moisture contained in the diluted anhydrous hydrogen obtained by the conventional bubbling method.

TABLE 6

| Temp. (°C.) | Moisture of liquefied anhydrous HF (ppm) | Moisture of diluted anhydrous HF gas (vppm) | Concentration of HF of diluted anhydrous HF gas (V %) |
|---|---|---|---|
| −20 | 10 | 0.042 | 20.4 |
| −50 | 10 | 0.011 | 4.6 |
| 70 | 10 | 0.010 | 1.4 |

TABLE 7

| Temp. (°C.) | Moisture of liquefied anhydrous HF (ppm) | Moisture of diluted anhydrous HF gas (vppm) | Concentration of HF of diluted anhydrous HF gas (V %) |
|---|---|---|---|
| −20 | 10 | 2.048 | 20.4 |
| −50 | 10 | 0.460 | 4.6 |
| −70 | 10 | 0.063 | 1.4 |

The obtained diluted anhydrous hydrogen fluoride is cooled and condensed with a liquefied nitrogen, then amount of moisture contained in the liquefied anhydrous hydrogen fluoride gas was measured by conductivity method. Concentration of the hydrogen fluoride contained in the diluted anhydrous hydrogen fluoride gas was analyzed by infrared absorption spectrum analysis method.

Nitrogen gas is generally used as inert gas, and in the event that the nitrogen gas should not be mixed with the diluted anhydrous hydrogen fluoride, a completely inert gas such as argon or helium is employed. Concentration of hydrogen fluoride contained can be adjusted in the range of 0.1 v % and 30 V %. In addition, standard anhydrous hydrogen fluoride gas can be produced by utilizing the generator of the invention.

EXAMPLES

For the purpose of recognizing excellent performance of the apparatus in accordance with the present invention, the inventors carried out a number of experiments on the etching of films, and some of them are hereinafter described as typical examples. Accordingly, it is to be understood that the invention is not limited to the under-described examples and that several variations or modifications of the film etching disclosed herein can be made by utilizing the etching area shown in Figures without departing from the spirit and scope of the invention.

EXAMPLES 1 TO 32

Oxide films formed on a silicon substrate under a variety of conditions were combined as described in respective examples and placed in the processing chamber. Internal part of the chamber was purged with high purity nitrogen gas, and after confirming by a dew-point meter that moisture was sufficiently decreased, a specified concentration of diluted anhydrous hydrogen fluoride gas was suppied to the chamber at the flow rate of 1 l/min. to etch the films. At this time concentration of hydrogen fluoride and silicon tetrafluoride gas being a reaction product was detected by the IR. Film thickness was measured with a profiler or an elipsometer. To determine whether or not the oxide films are actually etched, water wettability on the silicon substrate was checked. This is because oxide films are hydrophilic while silicon surface being not but water-repellent if oxide films are actually etched. Table 2 shows the results.

TABLE 2

| Example | Different oxide films | HF conc. v % | $H_2O$ conc. vppm | Thick. before etch. Å | Thick. after etch. Å | Wettability of water applied film *1 |
|---|---|---|---|---|---|---|
| | | | (1) | | | |
| 1 | Thermal oxide (1) | 2.0 | 1.0 | 9645 | 9645 | got wet |
| | Native oxide (1) | | | 6 | 0 | repellent |
| 2 | Thermal oxide (1) | 1.0 | 0.1 | 9645 | 9645 | got wet |
| | Native oxide (1) | | | 6 | 0 | repellent |
| 3 | Thermal oxide (1) | 0.5 | 5.0 | 9665 | 9665 | got wet |
| | Native oxide (2) | | | 6 | 0 | repellent |
| 4 | Thermal oxide (1) | 1.0 | 0.03 | 9665 | 9665 | got wet |
| | Native oxide (2) | | | 6 | 0 | repellent |
| 5 | Thermal oxide (2) | 1.5 | 1.0 | 1200 | 1200 | got wet |
| | Native oxide (3) | | | 11 | 0 | repellent |
| 6 | Thermal oxide (2) | 0.5 | 0.1 | 1200 | 1200 | got wet |
| | Native oxide (3) | | | 11 | 0 | repellent |
| 7 | Thermal oxide (2) | 0.3 | 0.01 | 1200 | 1200 | got wet |
| | Native oxide (3) | | | 11 | 0 | repellent |
| 8 | Thermal oxide (2) | 1.0 | 1.0 | 1210 | 1210 | got wet |
| | Native oxide (4) | | | 6 | 0 | repellent |
| 9 | Thermal oxide (2) | 0.6 | 0.01 | 1210 | 1210 | got wet |
| | Native oxide (4) | | | 6 | 0 | repellent |
| 10 | CVD | 0.6 | 1.0 | 6130 | 6130 | got wet |
| | Native oxide (1) | | | 6 | 0 | repellent |
| 11 | CVD | 0.3 | 1.0 | 6060 | 6060 | got wet |
| | Native oxide (3) | | | 11 | 0 | repellent |
| | | | (2) | | | |
| 12 | CVD | 0.5 | 0.1 | 6060 | 6060 | got wet |
| | Native oxide (3) | | | 11 | 0 | repellent |
| 13 | BSG (1) | 0.5 | 1.0 | 4940 | 4940 | got wet |
| | Native oxide (3) | | | 11 | 0 | repellent |
| 14 | BSG (1) | 0.5 | 0.01 | 4940 | 4940 | got wet |
| | Native oxide (3) | | | 11 | 0 | repellent |
| 15 | BSG (1) | 0.5 | 10.0 | 4890 | 4890 | got wet |
| | Native | | | 6 | 0 | repellent |

TABLE 2-continued

| | | | | | | |
|---|---|---|---|---|---|---|
| 16 | BSG (1) | 0.6 | 0.01 | 4890 | 4890 | got wet |
| | Native oxide (4) | | | 6 | 0 | repellent |
| 17 | BSG (2) | 0.5 | 1.0 | 4940 | 4940 | got wet |
| | Native oxide (3) | | | 11 | 0 | repellent |
| 18 | BSG (2) | 0.3 | 0.01 | 4940 | 4940 | got wet |
| | Native oxide (3) | | | 11 | 0 | repellent |
| 19 | BSG (3) | 0.6 | 0.5 | 4940 | 4940 | got wet |
| | Native oxide (4) | | | 6 | 0 | repellent |
| 20 | BSG (3) | 0.6 | 0.01 | 4940 | 4940 | got wet |
| | Native oxide (4) | | | 6 | 0 | repellent |
| 21 | Thermal oxide (1) | 2.0 | 1.0 | 9645 | 9645 | got wet |
| | BSG (1) | | | 4990 | 0 | repellent |
| 22 | Thermal oxide (1) | 1.0 | 0.1 | 9645 | 9645 | got wet |
| | BSG (1) | | (3) | 4990 | 0 | repellent |
| 23 | Thermal oxide (1) | 0.9 | 0.01 | 9645 | 9645 | got wet |
| | BSG (1) | | | 4990 | 0 | repellent |
| 24 | Thermal oxide (2) | 0.2 | 0.01 | 1200 | 1200 | got wet |
| | BSG (1) | | | 5020 | 0 | repellent |
| 25 | CVD | 0.1 | 0.02 | 6200 | 6200 | got wet |
| | PSG (2) | 1 | | 4890 | 0 | repellent |
| 26 | BSG (1) | 0.4 | 0.01 | 4835 | 4835 | got wet |
| | PSG (3) | | | 5395 | 0 | repellent |
| 27 | Thermal oxide (2) | 0.6 | 1.0 | 1210 | 1210 | got wet |
| | CVD | | | 6140 | 6140 | got wet |
| | Native oxide (4) | | | 6 | 0 | repellent |
| 28 | Thermal oxide (2) | 0.7 | 0.05 | 1210 | 1210 | got wet |
| | CVD | | | 6140 | 6140 | got wet |
| | Native oxide (4) | | | 6 | 0 | repellent |
| 29 | Thermal oxide (2) | 0.4 | 0.05 | 1210 | 1210 | got wet |
| | CVD | | | 6140 | 6140 | got wet |
| | Native oxide (3) | | | 11 | 0 | repellent |
| 30 | Thermal oxide (2) | 1.5 | 1.0 | 1220 | 1220 | got wet |
| | BSG (1) | | | 4835 | 0 | repellent |
| | Native oxide (4) | | | 6 | 0 | repellent |
| 31 | Thermal oxide (1) | 1.0 | 0.1 | 1220 | 1220 | got wet |
| | BSG (1) | | | 4835 | 0 | repellent |
| | Native oxide (4) | | | 6 | 0 | repellent |
| 32 | Thermal oxide (1) | 0.9 | 0.02 | 1220 | 1220 | got wet |
| | BSG (1) | | | 4835 | 0 | repellent |
| | Native oxide (4) | | | 11 | 0 | repellent |

Film formation conditions:

| | |
|---|---|
| Thermal oxide (1) | $O_2:H_2 = 4:6$ <br> 950 to 100° C. |
| Thermal oxide (2) | 1100° C. processing for 1 hr. |
| CVD | 400° C. |
| BSG (1) | $B_2H_6/SiH_4 = 1/5$ 1050° C. for 30 min. <br> 300° C. |
| BSG (2) | $B_2H_6/SiH_4 = 1/10$ 1050° C. for 30 min. <br> 300° C. |
| BSG (3) | $B_2H_6/SiH_4 = 1/20$ 1050° C. for 30 min. <br> 300° C. |
| PSG (1) | $PH_3/SiH_4 = 1/5$ 1050° C. for 30 min. <br> 300° C. |
| PSG (2) | $PH_3/SiH_4 = 1/10$ 1050° C. for 30 min. <br> 300° C. |
| PSG (3) | $PH_3/SiH_4 = 1/20$ 1050° C. for 30 min. <br> 300° C. |
| Native oxide (1) | 30% $H_2O_2$ 70° C. processing for 1 hr. |

TABLE 2-continued

|  | Pt catalyzer |
|---|---|
| Native oxide (2) | $HNO_3$ 70° C. processing for 5 min. |
| Native oxide (3) | $O_3$ processing for 1 hr. |
|  | low pressure mercury lamp |
| Native oxide (4) | hot-air drying |

*1 "got dry" means that oxide film remains, and "repellent" means that oxide film was completely etched away.

COMPARATIVE EXAMPLES 1 TO 4

As comparative examples, etching of films in the foregoing examples 8, 15, 28 and 30 was carried out also in the high $H_2O$ concentration region using an etching apparatus provided with moisture generator. Table 3 shows the results.

formed thereon, thus a complex film being formed. The complex film was etched with a diluted anhydrous hydrogen fluoride gas (whose concentration of hydrogen fluoride was 0.17 v %, concentration of $H_2O$ was 0.02 vppm and dew point was −97.3° C.). The result was that the PSG film alone was selectively etched without damage to the thermal oxide film.

TABLE 3

| Compar. example | Different oxide films | HF conc. v % | $H_2O$ conc. vppm | Thick. before etch. Å | Thick. after etch. Å | Wettability of water applied film *1 |
|---|---|---|---|---|---|---|
| 1 | Thermal oxide (2) | 1.0 | 500 | 1210 | 1210 | repellent |
|  | Native oxide (4) |  |  | 6 | 0 | repellent |
| 2 | BSG (1) | 0.5 | 800 | 4890 | 4890 | repellent |
|  | Native oxide (4) |  |  | 6 | 0 | repellent |
| 3 | Thermal oxide (2) | 0.7 | 1000 | 1210 | 0 | repellent |
|  | CVD |  |  | 6140 | 0 | repellen |
|  | Native oxide (4) |  |  | 6 | 0 | repellent |
| 4 | Thermal oxide (2) | 1.5 | 1.0 | 1220 | 0 | repellent |
|  | BSG (1) |  |  | 4835 | 0 | repellent |
|  | Native oxide (4) |  |  | 6 | 0 | repellent |

*1 "got dry" means that oxide film remains, and "repellent" means that oxide film was completely etched away.

EXAMPLE 33

Figure 17:
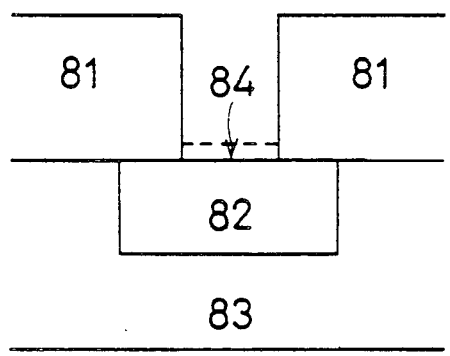
FIG. 17 is a schematic view showing that SiO is provided with a contact hole to be in contact with a region $n^+$ of source or drain of a MOSLSI formed on a P-type silicon substrate.

For cleaning after providing $SiO_2$ with a contact hole contacting a source or drain n+ region of MOSLSI formed on P-type silicon substrate as illustrated in FIG. 17, a wet process using a chemical has been heretofore employed. A problem, however, exists in that the chemical cannot evenly enter inside if diameter of hole is so small as to be 0.5 μm, and therefore it has been substantially impossible to carry out uniform etching or cleaning for such a small diameter hole. Cleaning with DI water cannot be carried out satisfactorily, either.

A thin native oxide film formed at the time of ozon cleaning was etched away without any damage to $SiO_2$ film to be served as a structural body of LSI, by using the apparatus of the invention after ozone cleaning and chlorine radical cleaning. That is to say, selective etching of the native oxide film was carried out with a hydrogen fluoride of 1.0 v % in concentration and $H_2O$ of 0.1 vppm in concentration using the critical concentrations of thermal oxide films and native oxide film shown in FIG. 14. Thus, a very clean bare silicon surface was successfully obtained. A contact of such very low contact resistance as $1 \times 10^{-8}$ Ω·cm² was obtained without heat treatment process by laminating such electrode materials as Al-Si, Al-Cu-Si, TiN-Al on the bare silicon surface.

EXAMPLE 34

Figure 18:
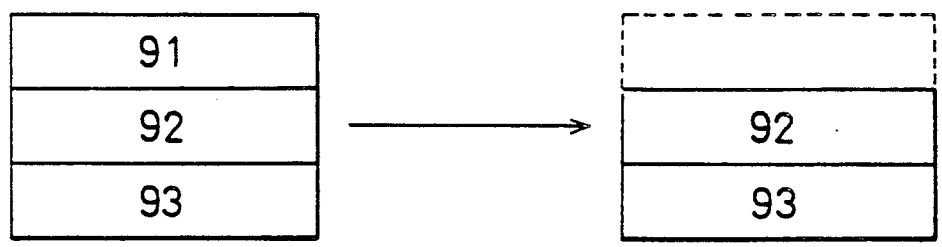
FIG. 18 is a schematic view in which a thermal oxide film was formed on a silicon substrate on which a PSG film was superposedly formed, then the PSG film was selectively etched with a diluted an hydrous hydrogen fluoride gas whose density of hydrogen fluoride is 0.17 v % and concentration of $H_2O$ is 0.02 vppm.

A thermal oxide film (950 Å) was formed on a polysilicon substrate as illustrated in FIG. 18, and a PSG film ($PH_3/SiH_4 = 1/20$) of 5000 Å was further

EXAMPLE 35

A stainless steel cylinder of 50 mm in diameter and 35 cm in length was filled with an anhydrous hydrogen fluoride, then was cooled to −49° C. A high purity nitorgen was supplied to the gaseous phase of the cylinder at the rate of 1 l/min. Concentration of hydrogen fluoride contained in the output gas was measured with IR. It was found that the concentration was 5.1 vol % (5.0 vol % in calculation) As a result of analysis, it was found that moisture was not more than 0.01 vppm.

EXAMPLE 36

A cylinder filled with a liquefied anhydrous hydrogen fluoride according to Example 33 was cooled to −26° C., and to which helium after passing a molecular sieve (dew point: −90° C., moisture: 0.09 vppm) was continuously supplied at the rate of 1.5 l/min. As a result of analysis of the produced diluted anhydrous hydrogen fluoride gas with IR, it was found that concentration of hydrogen fluoride was 17 vol % (17.4 vol % in calculation) and that of moisture was not more than 0.1 vppm.

EXAMPLE 37

A cylinder filled with a liquefied anhydrous hydrogen fluoride according to Example 33 was cooled to −50° C., and to which argon (moisture: 0.1 vppm) was continuously supplied at the rate of 0.5 l/min. As a result of analysis, it was found that concentration of hydrogen fluoride contained in the argon gas was 4.6 vol % (4.7 vol % in calculation) and that of moisture was not more than 0.1 vppm.

EXAMPLES 38 TO 43

A cylinder filled with a liquefied anhydrous hydrogen fluoride according to Example 1 was cooled to a predetermined temperature, and a high purity nitrogen (dew point: −80° C.) was continuously supplied to the gaseous phase portion of the cylinder filled with the liquefied anhydrous hydrogen fluoride at a certain rate, thereby standard HF/N gases containing hydrogen fluoride were produced. In this process, the standard gases of very low concentration were produced by dilution. Table 8 shows the results.

TABLE 8

| Ex. | Temp. (°C.) | Intro- duced $N_2$ (ml/min) | Diluted $N_2$ (ml/min) | Concentration of HF | |
|---|---|---|---|---|---|
| | | | | Value by Exper. | Value by Calc. |
| 38 | −59.0 | 1,000 | | 2.44 vol % | 2.50 vol. % |
| 39 | −48.6 | 1,000 | | 4.85 vol % | 4.80 vol. % |
| 40 | −42.5 | 1,000 | | 7.00 vol % | 7.00 vol. % |
| 41 | −67.3 | 10 | 990 | 164 vppm | 160 vppm |
| 42 | −70.0 | 10 | 990 | 133 vppm | 137 vppm |
| 43 | −80.0 | 10 | 990 | 47 vppm | 46 vppm |

What is claimed is:

1. A method for etching at least one of a plurality of films formed on a surface of a substrate comprising the steps of:
    providing said substrate without moisture in a chamber without moisture, said substrate having at least one of said films formed on a surface thereof;
    continuously supplying an anhydrous inert gas to said substrate;
    cooling a source of liquified anhydrous hydrogen fluoride so as to provide an anhydrous hydrogen fluoride gas, diluting said anhydrous hydrogen fluoride gas so as to provide a diluted anhydrous hydrogen fluoride gas and
    supplying said diluted anhydrous hydrogen fluoride gas to the surface of the substrate during at least a portion of the period of continuously supplying said an anhydrous inert gas to said substrate, for a sufficient time so as to etch said at least one of said films wherein said diluted anhydrous hydrogen fluoride contains between 0.001 to 0.3 vppm water vapor.

2. A method according to claim 1, wherein at least one of said at least one of said films is reactive with hydrogen fluoride and is selectively etched away while the other films are left by supplying hydrogen fluoride at a concentration in the diluted anhydrous hydrogen fluoride gas at a level which will react with the film to be etched but not with the other films.

* * * * *